(12) United States Patent
Suzuki

(10) Patent No.: US 7,651,191 B2
(45) Date of Patent: Jan. 26, 2010

(54) TEMPERATURE DETECTOR AND RECORDING APPARATUS INCLUDING THE SAME

(75) Inventor: Katsuaki Suzuki, Gifu (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 210 days.

(21) Appl. No.: 11/955,770

(22) Filed: Dec. 13, 2007

(65) Prior Publication Data

US 2008/0174629 A1    Jul. 24, 2008

(30) Foreign Application Priority Data

Dec. 13, 2006  (JP)  .............. 2006-336094
Dec. 13, 2006  (JP)  .............. 2006-336095

(51) Int. Cl.
*B41J 29/393*  (2006.01)

(52) U.S. Cl. .......................... 347/19; 347/17

(58) Field of Classification Search ............ 347/17, 347/19; 358/504
See application file for complete search history.

(56) References Cited

U.S. PATENT DOCUMENTS 5,281,980 A * 1/1994 Kishida et al. ............... 347/13
6,068,363 A * 5/2000 Saito ......................... 347/17
6,322,189 B1 * 11/2001 Anderson et al. ............. 347/17
6,373,423 B1   4/2002 Knudsen
2003/0058293 A1   3/2003 Tamura et al.
2004/0227651 A1   11/2004 Furuichi

FOREIGN PATENT DOCUMENTS

JP  2003075264 A  3/2003
JP  2005022294 A  1/2005

OTHER PUBLICATIONS

European Patent Office, European Search Report in related Patent Application No. EP 07254822, dated Jul. 22, 2008.

* cited by examiner

*Primary Examiner*—Lamson D Nguyen
(74) *Attorney, Agent, or Firm*—Baker Botts L.L.P.

(57) ABSTRACT

A temperature detector of the present invention includes a temperature sensor, a reference signal generation circuit, a level memory which rewritably stores therein a first signal level and a second signal level, a control circuit which controls the reference signal generation circuit so as to make a level of the reference signal change from the first signal level to the second signal level, a comparator circuit which compares the level of the reference signal and a level of the output signal, and a level rewriter which rewrites at least either one of the first signal level and the second signal level. When the level of the reference signal reaches the level of the output signal, the control circuit generates a detected temperature signal, and controls the level rewriter so as to change a range where a level of the reference signal changes.

21 Claims, 16 Drawing Sheets

TEMPERATURE DETECTOR AND RECORDING APPARATUS INCLUDING THE SAME

CROSS REFERENCE TO RELATED APPLICATION

The present application claims priority from Japanese Patent Applications No. 2006-336094 and No. 2006-336095, which were both filed on Dec. 13, 2006, the disclosures of which are herein incorporated by reference in their entirety.

BACKGROUND OF THE INVENTION

1. Field of the Invention

The present invention relates to a temperature detector which detects a temperature of a detection object, and also to a recording apparatus including the temperature detector.

2. Description of Related Art

There is an ink-jet printer which prints an image on a recording paper by ejecting ink droplets on the recording paper as a recording medium. As such an ink-jet printer, one including a recording head and a driver IC is known. The recording head has a passage unit in which nozzle for ejecting ink droplets and pressure chambers communicating with the nozzles are formed, and an actuator unit which applies ejection energy to ink contained in the pressure chambers. The driver IC generates a pulse for driving the actuator. The actuator applies ejection energy to a pressure chamber by changing a volume of the pressure chamber. The actuator is driven by a pulsed drive signal being supplied from the driver IC.

In an ink-jet printer of this type, speedup of printing is attempted, by increasing a pulse frequency of a drive signal which is outputted from the driver IC and thereby shortening a cycle of ejection of an ink droplet. However, when a pulse frequency of a drive signal is increased, heat generation of the driver IC is also increased. Japanese Unexamined Patent Publication No. 2005-22294 discloses a technique by which when a driver IC reaches a predetermined temperature or more the driver IC stops driving until cooled down, to thereby restrain the driver IC from becoming too high in temperature. In this way, thermal destruction of the driver IC can be prevented. Further, Japanese Unexamined Patent Publication No. 2003-075264 discloses a temperature detection circuit which includes a diode and a comparator in order to detect a temperature of a driver IC. An output voltage of the diode changes depending on a temperature. The comparator detects that an output voltage from the diode agrees with a reference voltage or a standard voltage which corresponds to a detection temperature. According to this technique, it can be sensed that a temperature of the driver IC is a detection temperature at a time when the comparator detects that an output voltage from the diode agrees with the reference voltage. Here, there has been known a technique of outputting a reference voltage in the form of a sawtooth wave or a triangular wave and sweeping it. Application of this technique enables detection of a wide range of temperatures of the driver IC.

SUMMARY OF THE INVENTION

The above-described technique involves following two problems. First, since a sweep range is always a constant, wide temperature range, a sweep period is elongated which lowers responsiveness in temperature detection. That is, even though a temperature of the driver IC is detected, the detected temperature is outputted during a next sweep cycle. As a result, there is a possibility that the temperature of the driver IC further rises before one sweep is completed. Therefore, it is necessary to set a detection temperature to a lower value in anticipation of a sudden rise in temperature of the driver IC. In such a case, the driver IC is driven at a low temperature irrespective of a rate of temperature change. This decreases a driving efficiency.

Second, since a temperature of the driver IC is detected only when the driver IC reaches the detection temperature, it is necessary to set a detection temperature to a lower value in anticipation of a sudden rise in temperature of the driver IC. In such a case, the driver IC is driven at a low temperature. This decreases a driving efficiency. Here, adopting a D/A converter as a circuit for changing the reference voltage is known, which increases costs however. Thus, known is a technique of using a circuit which outputs a PWM signal, a circuit which smoothes the PWM signal and generate a reference voltage, and a circuit which modulates a pulse width of the PWM signal. This technique allows a reference voltage to be changed by a low-cost circuit configuration. However, in order to generate a stable reference voltage with few ripples, for improving temperature detection accuracy, the smoothing circuit needs to have a sufficiently large time constant. When a time constant of the smoothing circuit is made larger, a phase lag of the reference voltage becomes larger, which lowers responsiveness in temperature detection.

An object of the present invention is to provide a temperature detector and a recording apparatus which present high responsiveness in temperature detection.

Another object of the present invention is to provide a temperature detector and a recording apparatus which present high responsiveness in temperature detection while suppressing reduction in temperature detection accuracy.

According to a first aspect of the present invention, there is provided a temperature detector comprising a temperature sensor, a reference signal generation circuit, a level memory, a control circuit, a comparator circuit, and a level rewriter. An output signal of the temperature sensor changes in level in accordance with change in temperature of a detection object. The reference signal generation circuit generates a level-changeable reference signal. The level memory rewritably stores therein a first signal level and a second signal level which determine a range where a level of the reference signal changes. The control circuit controls the reference signal generation circuit so as to make a level of the reference signal change from the first signal level to the second signal level stored in the level memory. The comparator circuit compares the level of the reference signal and a level of the output signal. The level rewriter rewrites at least either one of the first signal level and the second signal level stored in the level memory. The control circuit determines that the level of the reference signal has reached the level of the output signal in accordance with a result of comparison at the comparator circuit and generates, as a detected temperature signal indicating a current temperature of the detection object, a signal corresponding to the level of the reference signal generated by the reference signal generation circuit at a time when the level of the reference signal reaches the level of the output signal, and in addition the control circuit controls the level rewriter so as to change a range where a level of the reference signal changes in accordance with the signal indicating a temperature of the detection object.

In this aspect, values of the first signal level and the second signal level stored in the level memory are rewritten by the level rewriter in accordance with a temperature detected by the control circuit, so that a range of change in voltage of the reference signal is easily changed to an appropriate range corresponding to the level of the output signal of the temperature sensor. As a result, responsiveness in temperature detection can be improved.

According to a second aspect of the present invention, there is provided a temperature detector comprising a temperature sensor, a reference signal generation circuit, a level memory, a control circuit, and a comparator circuit. An output signal of the temperature sensor changes in level in accordance with change in temperature of a detection object. The reference signal generation circuit generates a level-changeable reference signal. The level memory rewritably stores therein a first signal level and a second signal level which determine a range where a level of the reference signal changes. The control circuit controls the reference signal generation circuit so as to make a level of the reference signal change from the first signal level to the second signal level stored in the level memory. The comparator circuit compares the level of the reference signal and a level of the output signal. The reference signal generation circuit includes a pulse signal generation circuit, and a smoothing circuit. The pulse signal generation circuit generates a pulse signal having a predetermined cycle. The pulse signal is generated in a sampling period which is made up of a plurality of the predetermined cycles, in such a manner that a total high-level period of the pulse signal in any of the predetermined cycles is the same and there are two or more kinds of patterns of periods during which the pulse signal is maintained at a high level in the predetermined cycle. The smoothing circuit smoothes the pulse signal generated by the pulse signal generation circuit and outputs the smoothed pulse signal as the reference signal. The control circuit changes a voltage of the reference signal within a range from the first signal level to the second signal level by changing a total high-level period of the pulse signal generated by the pulse signal generation circuit within each of the predetermined cycles on a sampling period basis as a unit, and the control circuit determines that the level of the reference signal has reached the level of the output signal in accordance with a result of comparison at the comparator circuit and generates, as a detected temperature signal indicating a current temperature of the detection object, a signal corresponding to the level of the reference signal generated by the reference signal generation circuit at a time when the level of the reference signal reaches the level of the output signal.

In this aspect, the pulse signal generation circuit generates such a pulse signal that there are two or more kinds of patterns of periods during which the pulse signal is maintained at a high level in the predetermined cycle. Therefore, a plurality of spectra of the pulse signal is dispersed. At this time, by optimizing the smoothing circuit in accordance with a pulse cycle which corresponds to a spectrum dispersed in a higher frequency, a time constant of the smoothing circuit can be made smaller while suppressing occurrence of a ripple. Consequently, a phase lag of the reference signal can be suppressed. Therefore, responsiveness in temperature detection can be improved while suppressing deterioration in temperature detection accuracy.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

First Embodiment

Figure 1:
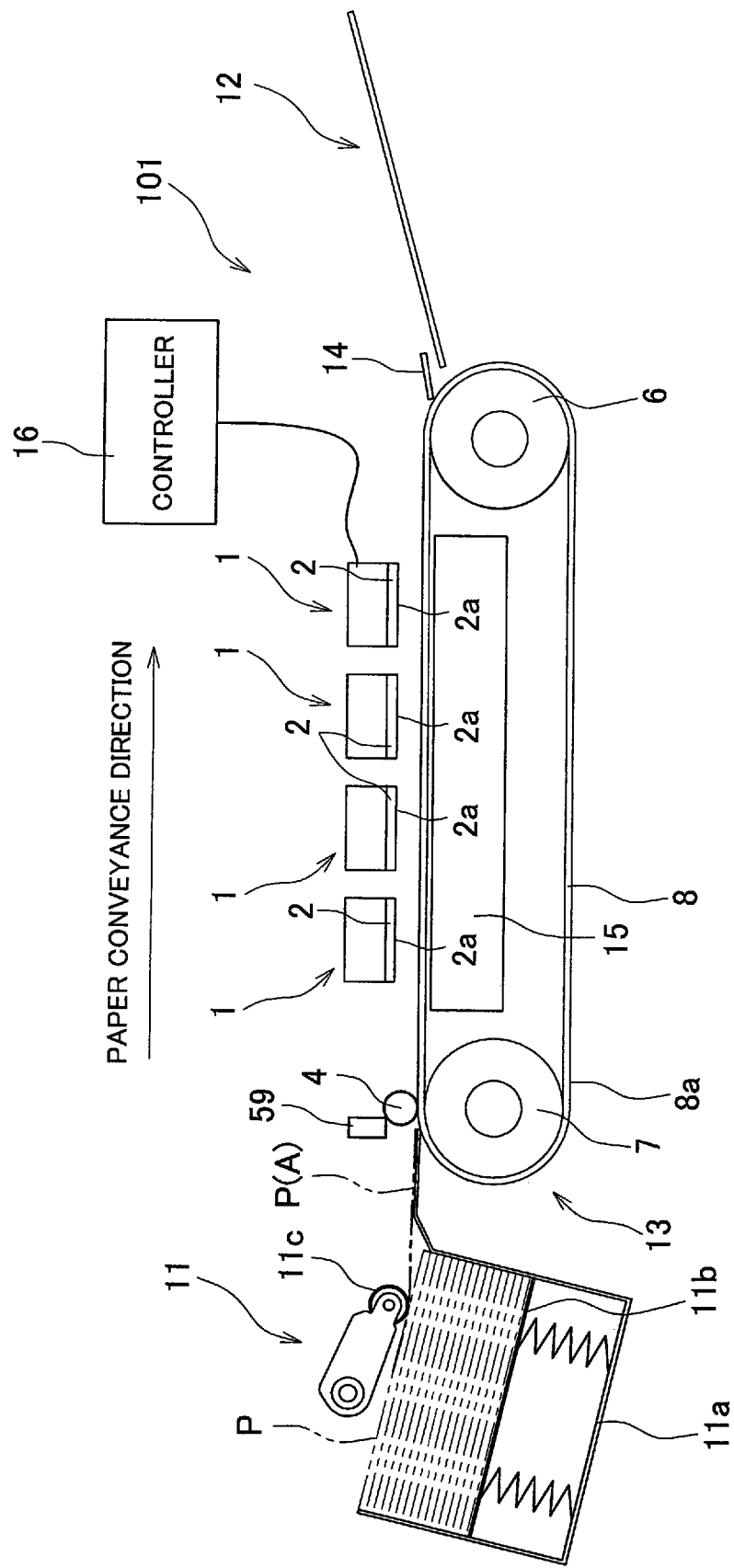
FIG. 1 is a side view of an ink-jet printer which is a recording apparatus including a temperature detector according to a first embodiment of the present invention.

FIG. 1 is a side view of an ink-jet printer which is a recording apparatus including a temperature detector according to a first embodiment of the present invention. As shown in FIG. 1, an ink-jet printer 101 which is a recording apparatus is a color ink-jet printer including four ink-jet heads 1 which mean recording heads. The ink-jet printer 101 has a controller 16 which controls an operation of a whole of the ink-jet printer 101. The ink-jet printer 101 includes a paper feed unit 11 and a paper discharge tray 12, which are shown in left and right parts of FIG. 1, respectively.

Formed within the ink-jet printer 101 is a paper conveyance path through which a paper P which is a recording medium is conveyed from the paper feed unit 11 toward the paper discharge tray 12. The paper feed unit 11 has a paper stocker 11a and a pick-up roller 11c. The paper stocker 11a, which accommodates a plurality of papers P therein, is disposed in such a manner that its opening which opens upward is inclined rightward in FIG. 1. In the paper stocker 11a, a support plate 11b which is biased from a bottom of the paper stocker 11a toward the opening is disposed. A stack of papers P is put on the support plate 11b. By being driven by a placement motor 11d (see FIG. 3), the pick-up roller 11c picks up the stack of papers P one by one from a top, and sends out the paper thus picked up, to a downstream side. A paper sensor 59 is provided immediately downstream of the paper feed unit 11. The paper sensor 59 detects whether a paper P which has been sent out by the pick-up roller 11c reaches a printing standby position A located immediately upstream of a conveyor belt 8, or not. The paper sensor 59 is adjusted to detect a leading edge of a paper P when the paper P is in the printing standby position A. A paper P sent out of the paper stocker 11a by the pick-up roller 11c passes the printing standby position A, and is placed onto an outer surface 8a of the conveyor belt 8.

A conveyor 13 is provided in a middle of the paper conveyance path. The conveyor 13 includes two belt rollers 6 and 7, an endless conveyor belt 8 which are wound on the rollers 6 and 7 so as to be stretched therebetween, a conveyor motor 19 (see FIG. 3) which rotates the belt roller 6, and a platen 15 which is disposed within a region enclosed by the conveyor belt 8. A surface of the conveyor belt 8 has adhesiveness. The platen 15 supports the conveyor belt 8 to prevent the conveyor belt 8 from being flexed down in its portion opposed to the ink-jet heads 1. A nip roller 4 is disposed at a position opposed to the belt roller 7. When a paper P is placed onto the outer surface 8a of the conveyor belt 8, the nip roller 4 presses the paper P onto the outer surface 8a. When the conveyor motor 19 rotates the belt roller 6, the conveyor belt 8 is driven. The conveyor belt 8 has, on its surface, a silicone resin layer with weak adhesiveness. This allows the conveyor belt 8 to convey a paper P toward the paper discharge tray 12 while adhesively holding the paper P.

As shown in FIG. 1, a peeling plate 14 is provided immediately downstream of the conveyor belt 8. The peeling plate 14 peels a paper P, which has been held on the outer surface 8a of the conveyor belt 8, from the outer surface 8a, and leads the paper P toward the paper discharge tray 12 located in the right part of FIG. 1.

The four ink-jet heads 1, which correspond to for colors of ink, namely, magenta (M), yellow (Y), cyan (C), and black (K), are arranged side by side along a conveyance direction of the paper P, and fixed. That is, the ink-jet printer 101 is a line-type printer. Each of the four ink-jet heads 1 has a head main body 2 at its lower end. The head main body 2 has a rectangular parallelepiped shape elongated in a direction perpendicular to the conveyance direction. A bottom face of the head main body 2 serves as an ink ejection face 2a which is opposed to the outer surface 8a of the conveyor belt 8.

While a paper P being conveyed by the conveyor belt 8 is passing just under the four head main bodies 2 sequentially, ink droplets of respective colors are ejected from the ink ejection faces 2a toward an upper face, that is, a print region, of the paper P. Thereby, a desired color image is formed in the print region on the paper P. A controller 16 which will be described later performs the above-described operations of paper feeding, image forming, and paper discharging in a synchronous and smooth manner.

Figure 2:
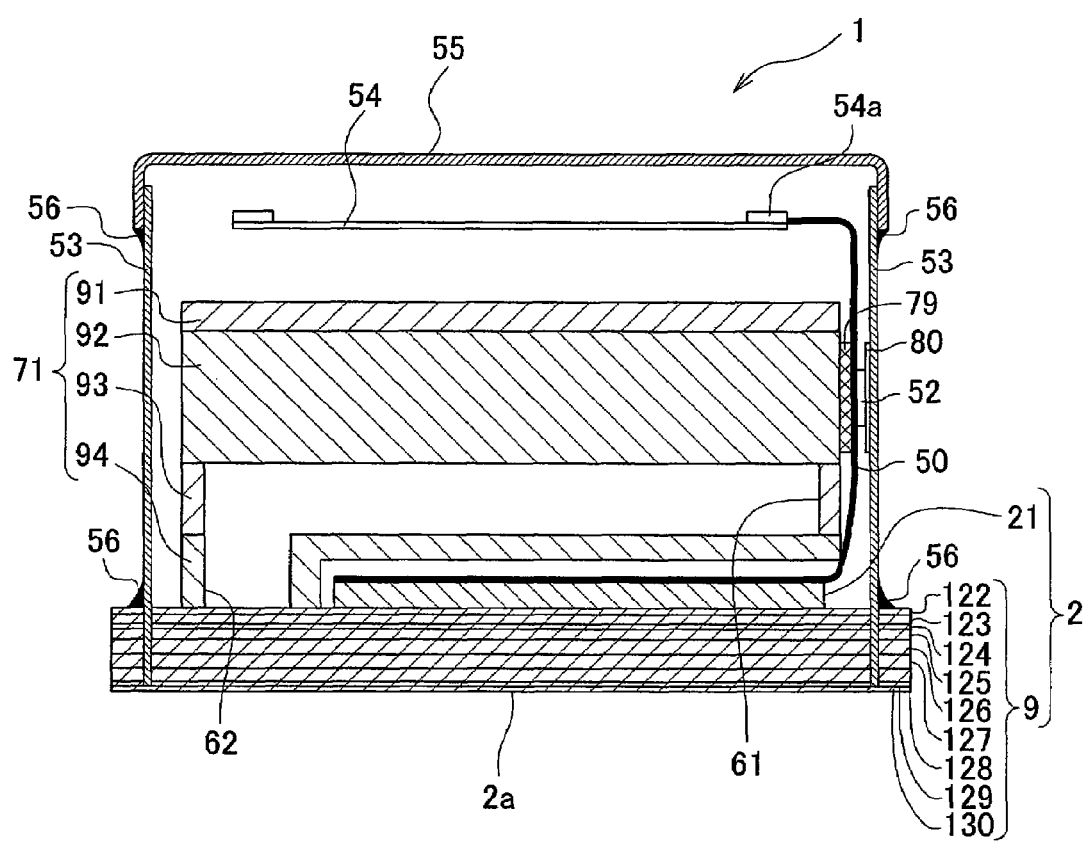
FIG. 2 is a sectional view taken along a widthwise direction of the ink-jet head shown in FIG. 1.

Next, the ink-jet head 1 will be described in detail with reference to FIG. 2. FIG. 2 is a sectional view taken along a widthwise direction of the ink-jet head 1. As shown in FIG. 2, the ink-jet head 1 is made up of a passage member in which a passage is formed, an electrical member which makes ink ejected from the passage member, and a cover member which protects the electrical member. The passage member includes a head main body 2 and a reservoir unit 71. The head main body 2 includes a passage unit 9 and an actuator unit 21. The reservoir unit 71 is disposed on an upper face of the head main body 2. The reservoir unit 71 temporarily stores ink therein, and supplies the stored ink to the head main body 2. The electrical member includes a COF (Chip On Film) 50 mounted with a driver IC 52, and a circuit board 54 electrically connected to the COF 50. One end of the COF 50 is connected to the actuator unit 21, so that a drive signal generated in the driver IC 52 is supplied to the actuator unit 21. The cover member has side covers 53 and a head cover 55. The cover member accommodates the electrical member therein, and prevents entry of ink mist from the outside.

In the head main body 2, as shown in FIG. 2, the actuator unit 21 is fixed to the upper face of the passage unit 9. The passage unit 9 has a layered structure of metal plates 122 to 130 and has, on its lower face, an ink ejection face 2a where a plurality of nozzles which eject ink droplets are opened. Also, a not-shown common ink passage to which ink is supplied, and a plurality of individual ink passages each extending from the common ink passage through a pressure chamber to a nozzle are formed within the passage unit 9.

The actuator unit 21 includes a plurality of actuators which correspond to respective pressure chambers of the passage unit 9, and selectively applies ejection energy to ink in the pressure chambers. In this embodiment, the actuator unit 21 is made of a lead zirconate titanate (PZT)-base ceramic material having ferroelectricity, and is a piezoelectric-type actuator having a piezoelectric sheet (piezoelectric layer). The piezoelectric sheet is sandwiched between a common electrode and individual electrodes which are opposed to the pressure chambers. The common electrode is, in its region corresponding to every pressure chamber, equally given the ground potential. On the other hand, the individual electrodes are electrically connected to respective terminals of the driver IC 52 through internal wirings of the COF 50, so that a drive signal from the driver IC 52 is selectively inputted to the individual electrodes.

That is, in the actuator unit 21, a portion sandwiched between an individual electrode and a pressure chamber act as an individual actuator, and there are a plurality of actuators corresponding to the number of pressure chambers. By inputting a drive signal to an individual electrode, a region of the actuator unit 21 corresponding to this individual electrode deforms protrudingly toward the inside of a pressure chamber. As a result, pressure, that is, ejection energy, is applied to ink contained in the pressure chamber, to generate a pressure wave in the pressure chamber. By the generated pressure wave propagating from the pressure chamber to a nozzle, an ink droplet is ejected from the nozzle.

The reservoir unit 71 is made up of four metal plates 91 to 94 which are put in layers while being positioned to each other. An ink passage including an ink reservoir 61 and ink outflow passages 62 is formed within the reservoir unit 71. The reservoir unit 71 communicates, in its lower face, with the ink passage formed within the passage unit 9. Both of the units 71 and 9 are bonded to each other with an adhesive, and thermally coupled to each other, too. Ink supplied from a not-shown ink tank is temporarily stored in the ink reservoir 61. The ink stored in the ink reservoir 61 is supplied through ink outflow passages 62 to the common ink passage of the passage unit 9.

At one end of the COF 50, the internal wirings of the COF 50 are electrically connected to electrodes which are formed on an upper face of the actuator unit 21. The COF 50 extends from the upper face of the actuator unit 21 upward through a space between the side cover 53 and the reservoir unit 71, and the other end of the COF 50 is connected to the circuit board 54 via a connector 54a. The circuit board 54 relays a signal from the controller 16 to the COF 50.

The driver IC 52 outputs a drive signal to the actuator unit 21 through the wiring of the COF 50. The driver IC 52 has a temperature signal generation circuit 40 (see FIG. 3) for detecting a temperature of the driver IC 52 (which is substantially equivalent to a temperature of the ink-jet head 1). The driver IC 52 is biased toward the side cover 53 by a sponge 79 which is adhered to a side face of the reservoir unit 71. The driver IC 52 is in tight contact with an inside face of the side cover 53 with a dissipation sheet 80 sandwiched therebetween. Thereby, the driver IC 52 is thermally coupled with the side cover 53.

The side cover 53 is a plate member made of a metal, and extends upward from a vicinity of each widthwise end of the upper face of the passage unit 9. A lower end of the side cover 53 is engaged with a groove formed in the passage unit 9. The side cover 53 and the passage unit 9 are accordingly thermally coupled with each other. As described above, the driver IC 52 and the side cover 53 are thermally coupled with each other, and in addition the reservoir unit 71 and the passage unit 9 are thermally coupled with each other. Therefore, all of the driver IC 52, the side cover 53, the passage unit 9, and the reservoir unit 71 are thermally coupled with one another. Consequently, heat of the driver IC 52 is dissipated to the outside through the side cover 53, the passage unit 9, and the reservoir unit 71.

The head cover 55 is mounted over the two side covers 53 so as to connect the two side covers 53 and so as to seal a space above the reservoir unit 71. The reservoir unit 71, the COF 50 and the circuit board 54 are disposed in the space thus enclosed by the two side covers 53 and the head cover 55. Sealing members 56 made of a silicon resin or the like are applied to where the side cover 53 and the passage unit 9 are connected to each other, and where the side cover 53 and the head cover 55 are fitted to each other. As a result, entry of ink mist from the outside can more surely be prevented.

Figure 3:
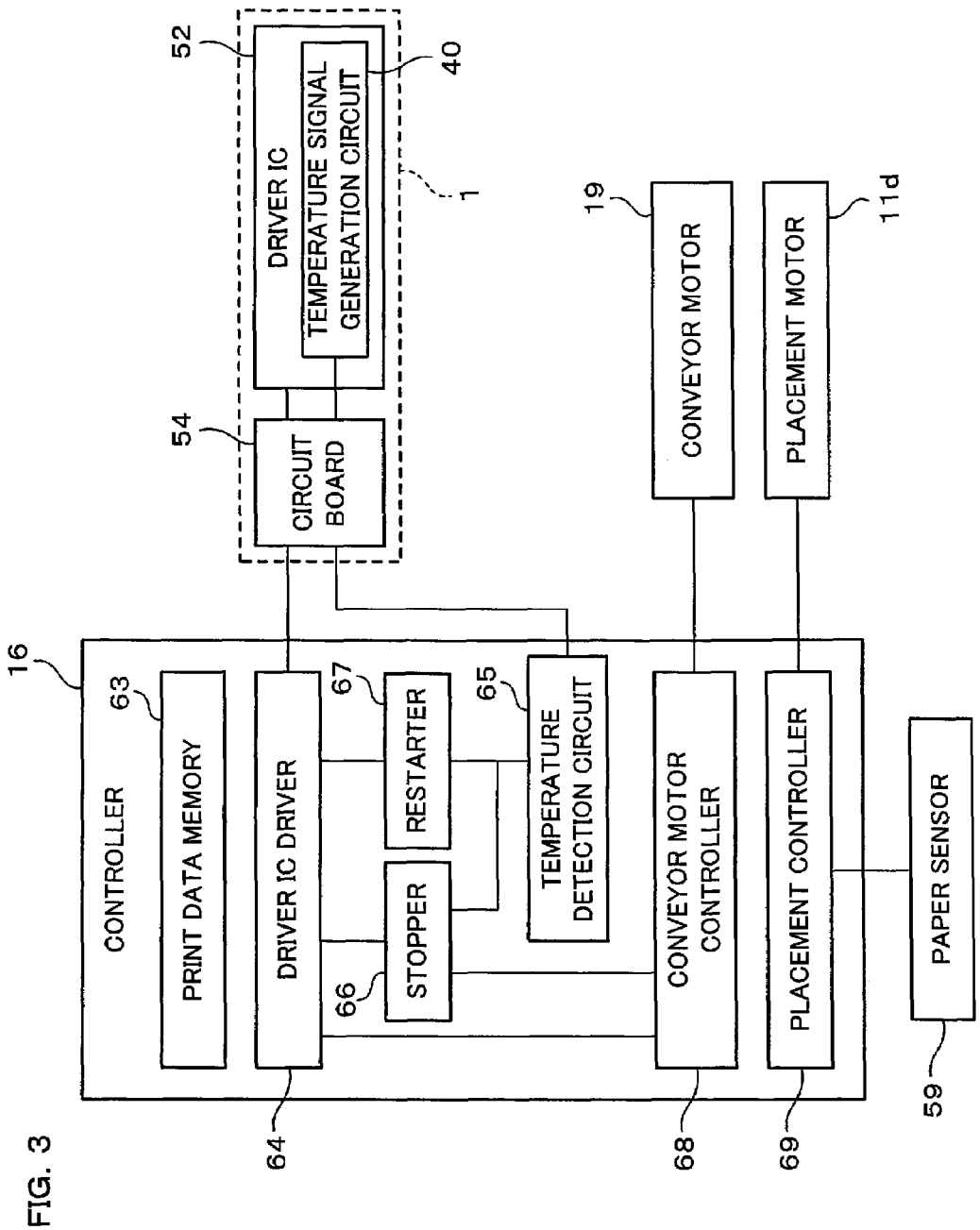
FIG. 3 is a block diagram of a controller shown in FIG. 1.

Next, the controller 16 will be described in detail with reference to FIG. 3. FIG. 3 is a block diagram of the controller 16. As shown in FIG. 3, the controller 16 has a print data memory 63, a driver IC driver 64, a temperature detection circuit 65, a stopper 66, a restarter 67, a conveyor motor controller 68, and a placement controller 69.

The print data memory 63 stores therein print data which are transferred from a not-shown higher-order device such as a host computer. The print data include the number of papers P to be continuously printed, and image data relating to images to be printed on the respective paper P.

The temperature detection circuit 65 detects a temperature T of the driver IC 52 based on a temperature detection signal which is outputted from the temperature signal generation circuit 40 of each driver IC 52.

Based on print data stored in the print data memory 63, the driver IC driver 64 drives the driver IC of each ink-jet head 1 in such a manner that a to-be-printed image is formed on the paper P. In this embodiment, the driver IC driver 64 drives the driver IC 52 under a condition that a printing processing for forming an image on one paper P is one driving unit.

In order to prevent thermal destruction of the driver IC 52, when the temperature detection circuit 65 detects a temperature T which is equal to or higher than a predetermined upper-limit temperature Toff (100 degrees C. for example), the stopper 66 stops driving of the driver IC 52 which is driven by the driver IC driver 64 under a state where driving of the driver IC 52 corresponding to one driving unit is completed, in other words, where a printing operation on the paper P is completed. This can prevent wasteful use of papers P, and remove danger that in-printing image data will be lost. Here, the upper-limit temperature Toff is set to a temperature lower than a temperature at which thermal destruction of the driver IC occurs.

When, after the stopper 66 stops driving of the driver IC 52 driven by the driver IC driver 64, the temperature T of the driver IC 52 detected by the temperature detection circuit 65 becomes equal to or lower than a predetermined restart temperature Ton (80 degrees C. for example), the restarter 67 restarts driving of the driver IC 52 which is driven by the driver IC driver 64.

The conveyor motor controller 68 controls the conveyor motor 19, and thereby travels the conveyor belt 8 in such a manner that the paper P is conveyed at a speed corresponding to a predetermined print cycle. Here, a print cycle means a cycle of ejection of an ink droplet from a nozzle. In other words, a print cycle means a time required for a paper P to be conveyed by the conveyor 13 by a unit distance which corresponds to a printing resolution of an image to be printed on the paper P.

The placement controller 69 controls the placement motor 11*d* and thereby controls driving of the pick-up roller 11*c*. Based on a detection result of the paper sensor 59, the placement controller 69 determines whether a leading edge of a paper P which has been sent out by the pick-up roller 11*c* reaches the printing standby position A or not. When the paper P reaches the printing standby position A, driving of the pick-up roller 11*c* is once stopped. At this time, in a case where driving of the driver IC 52 is being stopped by the stopper 66, the placement controller 69 keeps the paper P waiting in the printing standby position A. The paper P is kept waiting until the restarter 67 determines that driving of the driver IC 52 can be restarted.

Figure 4:
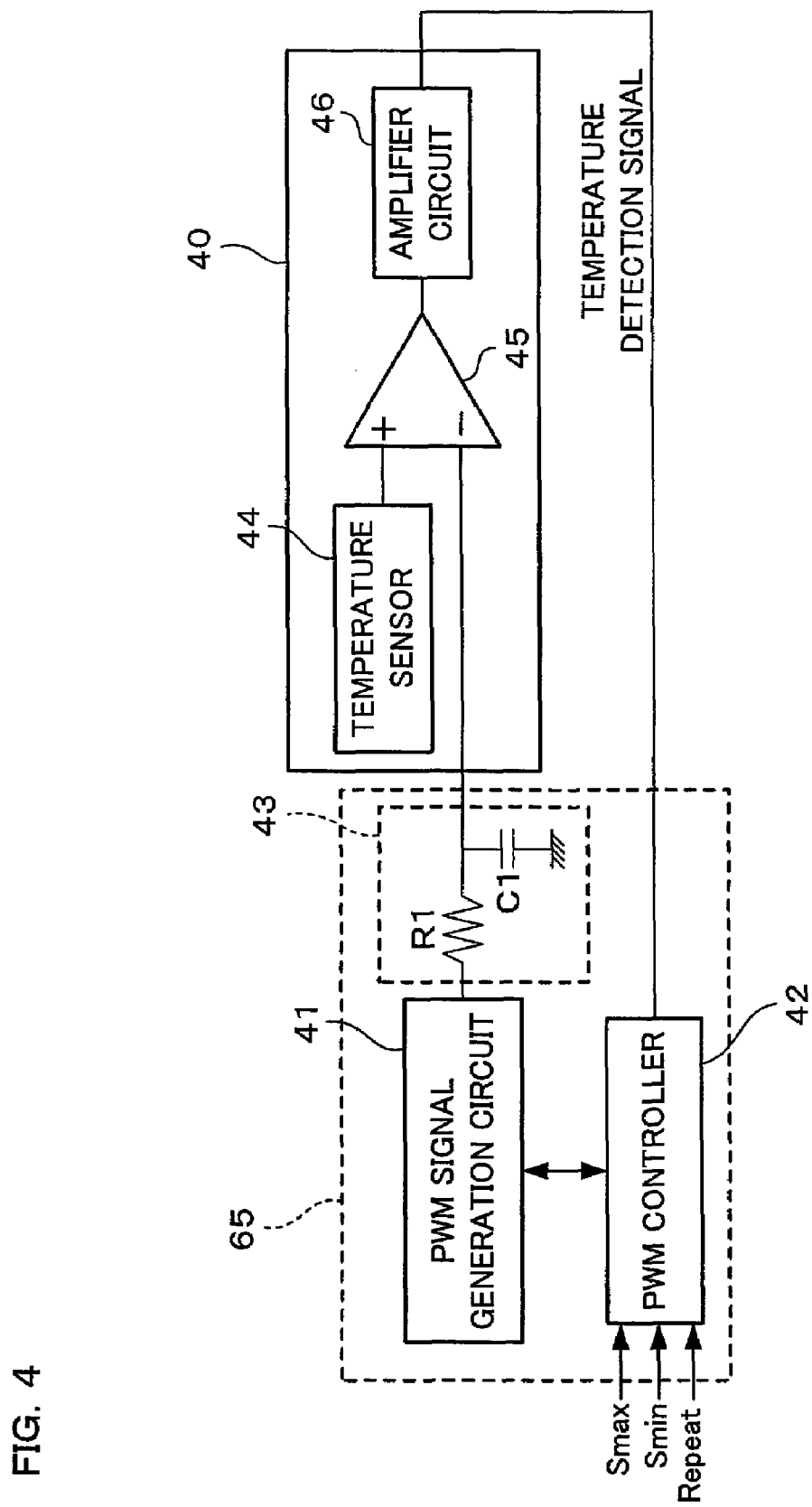
FIG. 4 is a block diagram of a temperature signal generation circuit and a temperature detection circuit shown in FIG. 3.

Next, the temperature signal generation circuit 40 and the temperature detection circuit 65 will be described in detail with reference to FIG. 4. FIG. 4 is a block diagram of the temperature signal generation circuit 40 and the temperature detection circuit 65.

Figure 5:
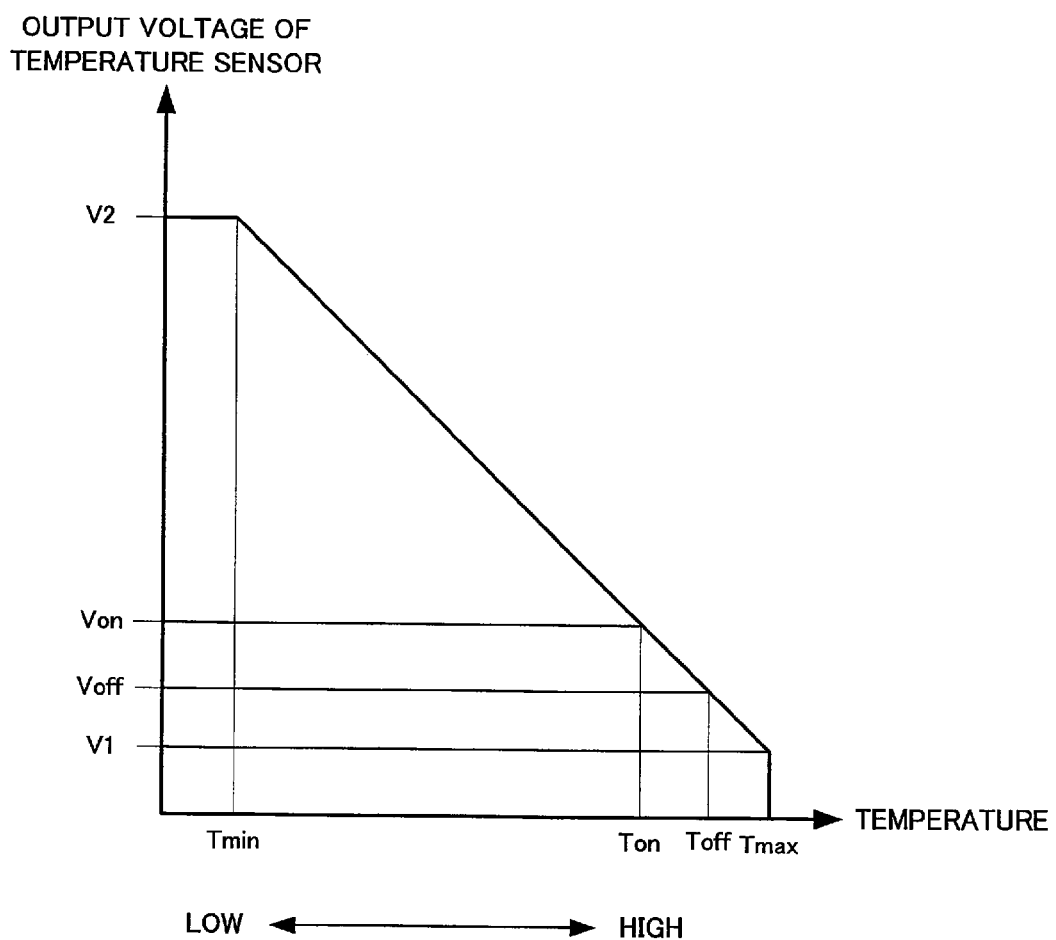
FIG. 5 is a graph showing temperature characteristics of a voltage outputted from a temperature sensor shown in FIG. 4.

As shown in FIG. 4, the temperature signal generation circuit 40 includes a temperature sensor 44, a comparator 45 which is a detection circuit or a comparator circuit, and an amplifier circuit 46. The temperature sensor 44 will be described with reference to FIG. 5. FIG. 5 is a graph showing temperature characteristics of a voltage outputted from the temperature sensor 44. The temperature sensor 44 is provided in a part of a semiconductor which forms the driver IC 52. An energy gap or an energy barrier of a semiconductor changes depending on a temperature, and it decreases as a temperature rises. The temperature sensor 44, which takes advantage of such characteristics of a semiconductor, outputs a voltage which corresponds to an energy gap or an energy barrier. As shown in FIG. 5, temperature characteristics of the temperature sensor 44 exhibits a good linearity over a relatively wide range. The temperature sensor 44 outputs a voltage Voff for the upper-limit temperature Toff, and a voltage Von for the restart temperature Ton.

The comparator 45 compares an output voltage from the temperature sensor 44 and a reference voltage which is a reference signal from the temperature detection circuit 65 with each other. When the output voltage and the reference voltage agree with each other, that is, when a level of the reference voltage reaches a level of the output voltage, the comparator 45 outputs a temperature detection signal. The temperature detection signal is a signal including temperature information of the driver IC 52 and the ink-jet head 1, and more specifically a signal indicating a timing of detection of that temperature. The amplifier circuit 46 amplifies the temperature detection signal outputted from the comparator 45. The temperature detection signal amplified by the amplifier circuit 46 is outputted to a PWM controller 42 of the temperature detection circuit 65. The reference voltage sweeps so as to increase step by step within a range from a minimum reference voltage V1 which corresponds to a maximum temperature Tmax in a detection temperature range to a maximum reference voltage V2 which corresponds to a minimum temperature Tmin in the detection temperature range, as will be described later. The reference voltage sweeps repeatedly at a variable sweep cycle (see FIG. 8). The temperature detection signal is a signal indicating a timing at which a temperature of the driver IC 52 is detected in each sweep cycle. The temperature detection signal is a pulse signal which changes from a low level to a high level at this timing. In an example shown in FIG. 8, for easy understanding of how a reference voltage changes in the sweep cycle, a duty of a reference voltage obtained by smoothing a PWM signal which will be described later is stepped up by 10%. A temperature range for sweeping contains the upper-limit temperature Toff and the restart temperature Ton.

Next, the temperature detection circuit 65 will be described with reference to FIGS. 4 and 6. The temperature detection circuit 65 generates a reference voltage and outputs it to the temperature signal generation circuit 40. In addition, the temperature detection circuit 65 detects a temperature T of the driver IC 52 at a time when a temperature detection signal is outputted from the temperature signal generation circuit 40, and the temperature detection circuit 65 outputs a detection result as a detected temperature signal. As shown in FIG. 4, the temperature detection circuit 65 includes a PWM signal generation circuit 41 which is a pulse signal generation circuit, a PWM controller 42, and a smoothing circuit 43.

The PWM signal generation circuit 41 generates a Pulse Width Modulation (PWM) signal having only a single pulse within a predetermined PWM cycle. FIG. 6 shows a relationship between a PWM signal which is outputted from the PWM signal generation circuit 41 and a reference voltage (Vref) which is obtained by smoothing the PWM signal. In examples shown in FIG. 6, a pulse width which means a duty is 100%, 50%, 25%, and 10%. The PWM signal generated by the PWM signal generation circuit 41 is outputted to the smoothing circuit 43.

The PWM controller 42 modulates a pulse width of a PWM signal which is generated by the PWM signal generation circuit 41, and in addition detects a temperature T of the driver IC 52. A temperature of the driver IC 52 is determined based on a pulse width of the PWM signal at a timing when a temperature detection signal from the temperature signal generation circuit 40 changes from a low level to a high level. The detected temperature T is outputted as the detected temperature signal (see FIG. 7).

The smoothing circuit 43, which is a CR integration circuit including a resistance R1 and a capacitor C1, smoothes the PWM signal generated by the PWM signal generation circuit 41. A value of the resistance R1 and the capacitor C1, that is, a time constant (CR) of the smoothing circuit 43 is determined in such a manner that, within a range sufficiently shorter than the PWM cycle, a ripple after smoothing is smaller than a predetermined allowable conversion error and in addition a response delay caused by smoothing is smaller than a predetermined allowable response delay which is allowed in a system. A signal smoothed by the smoothing circuit 43 is outputted as a reference signal to the comparator 45 of the temperature signal generation circuit 40. In other words, the PWM signal generation circuit and the smoothing circuit 43 form a reference signal generation circuit.

Figure 6:
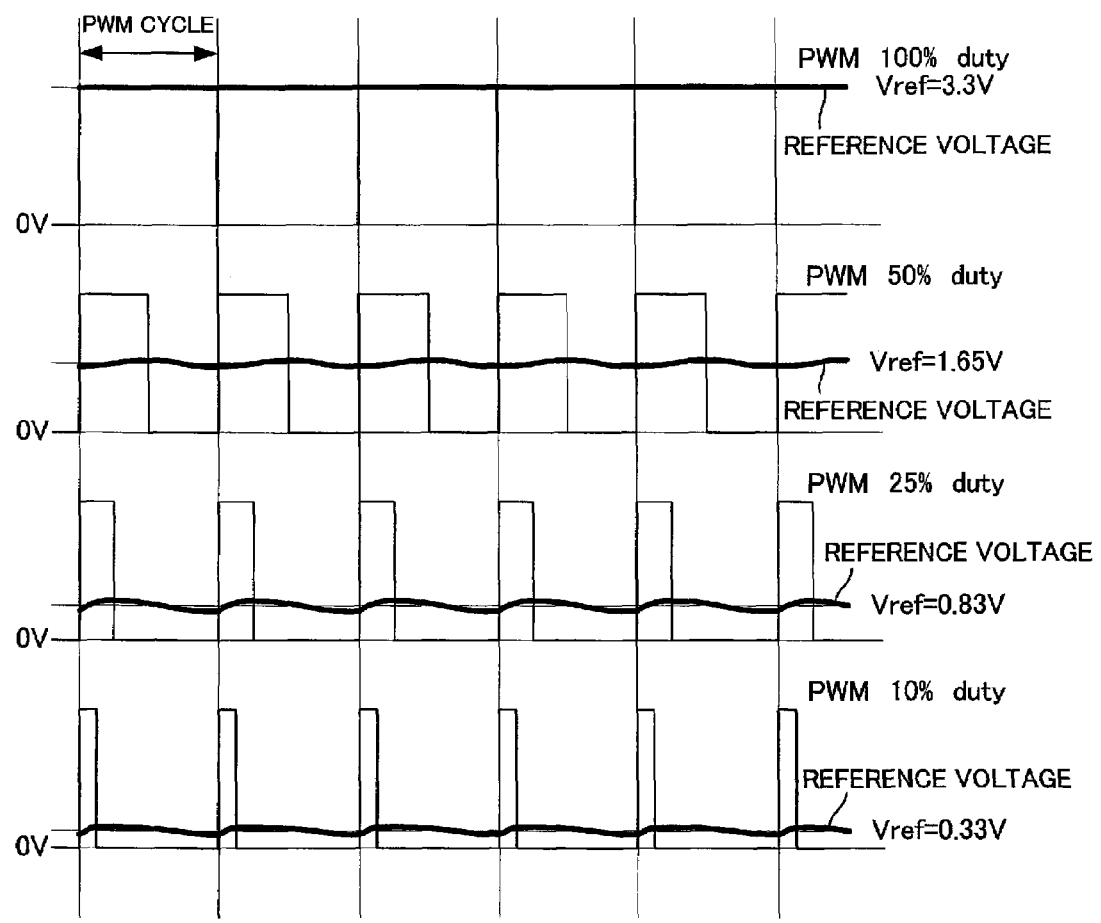
FIG. 6 shows a relationship between a reference voltage and a PWM signal which is outputted from a PWM signal generation circuit shown in FIG. 4.

The PWM controller 42 modulates a pulse width of the PWM signal, so that the reference voltage is changed as shown in FIG. 6. The PWM signal is a pulse train including a plurality of pulses having the same pulse width. A period during which the plurality of pulses having the same pulse width continue is equivalent to a sampling period which means a period during which one step is maintained in the reference voltage shown in FIG. 8. In this embodiment, there are the same number of pulses in any sampling period. In addition, a pulse interval in the sampling period is constant. Every time one sampling period ends, pulse widths of pluses which are sequentially outputted from the PWM signal generation circuit 41 are changed, and more specifically they are gradually increased or decreased. Consequently, the reference voltage changes step by step within a predetermined voltage range. When the reference voltage finishes changing from an upper limit to a lower limit or from a lower limit to an upper limit within a voltage range corresponding to the detection temperature range, one sweep operation is completed. Here, a time length required for one sweep operation will be referred to as "one sweep cycle".

Figure 7:
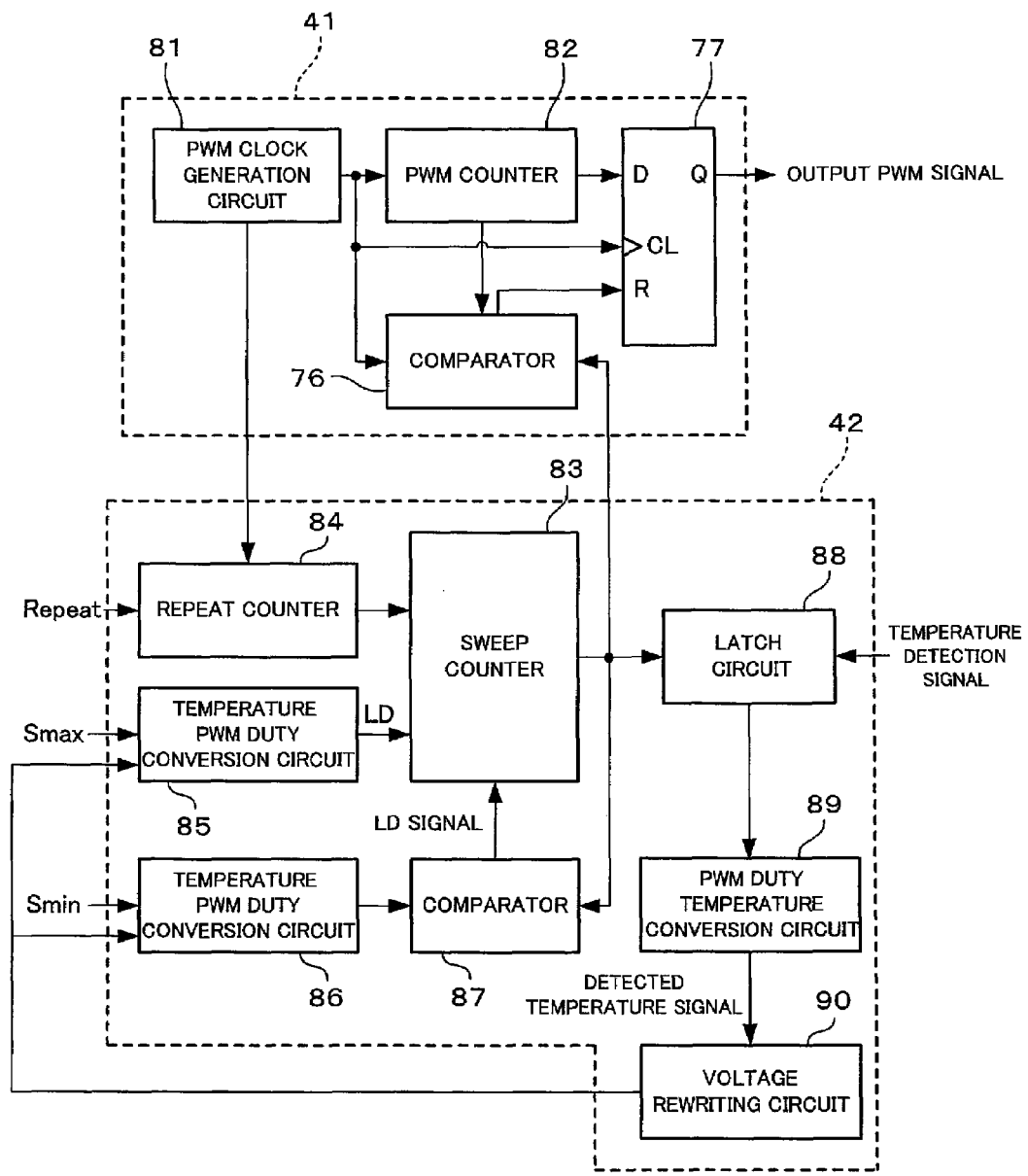
FIG. 7 is a block diagram of the PWM signal generation circuit and a PWM controller shown in FIG. 4.
Figure 8:
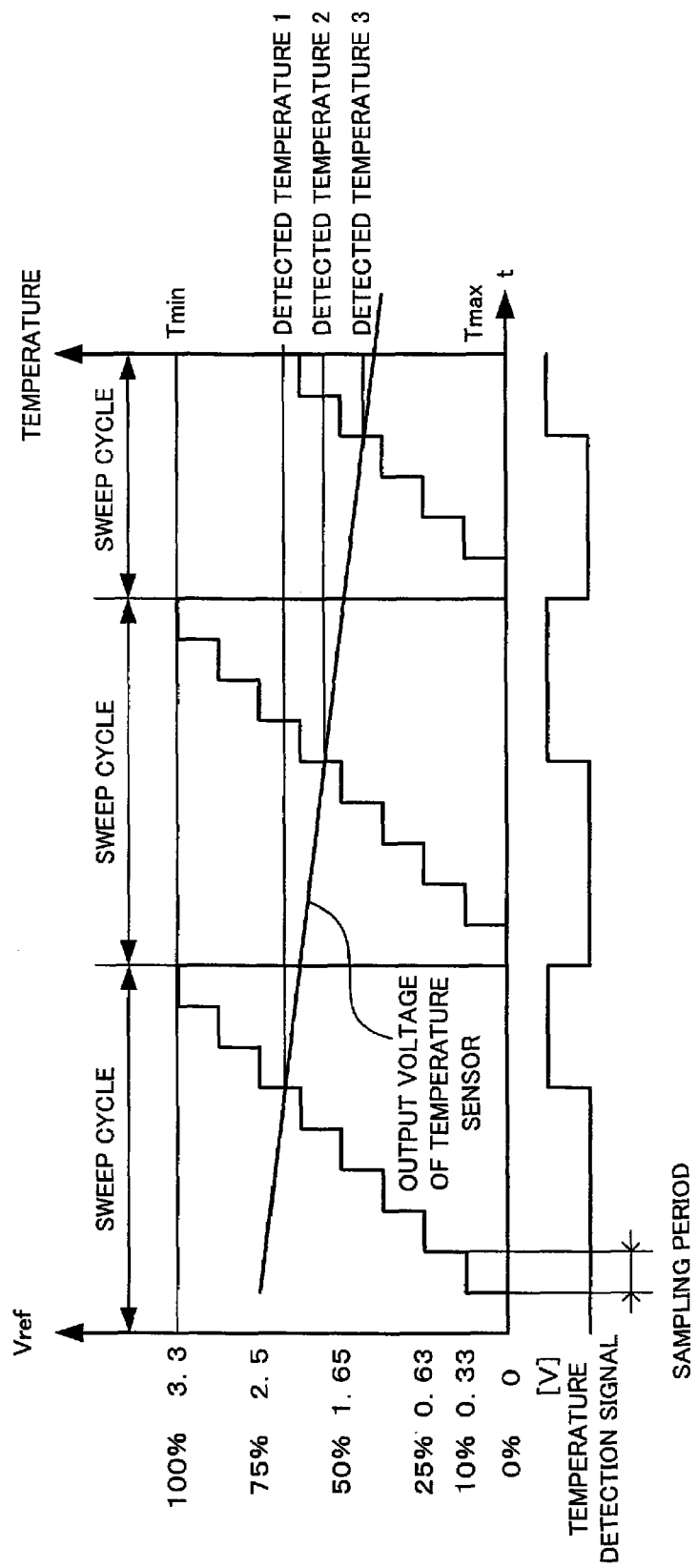
FIG. 8 shows a relationship between a reference voltage and an output voltage from the temperature sensor in the temperature signal generation circuit shown in FIG. 3.

Next, the PWM signal generation circuit 41 and the PWM controller 42 will be described with reference to FIGS. 7 and 8. FIG. 7 is a block diagram of the PWM signal generation circuit 41 and the PWM controller 42. FIG. 8 shows a relationship between the reference voltage from the temperature detection circuit 65 and an output voltage from the temperature sensor 44.

As shown in FIG. 7, the PWM signal generation circuit 41 includes a PWM clock generation circuit 81, a PWM counter 82, a comparator 76, and a flip flop (DFF: D Flip Flop) 77. The PWM clock generation circuit 81 is a circuit which generates a PWM clock which means a reference clock for the PWM signal generated by the PWM signal generation circuit 41. A PWM clock generated by the PWM clock generation circuit 81 is outputted to the PWM counter 82, the comparator 76, the flip flop 77, and a repeat counter 84 of the PWM controller 42. In this embodiment, the PWM clock generation circuit 81 generates 4096 reference clocks at the maximum in every PWM cycle.

The PWM counter 82 is a counter which counts a predetermined number of PWM clocks in each PWM cycle. For example, the PWM counter 82 is a ring counter which counts the PWM clocks from 0 to 409 in every PWM cycle. Thus, the PWM cycle is constant. When a counted number changes from 0 to 1, the PWM counter 82 outputs a pulse to a data (D) terminal of the flip flop 77. At this time, an output signal from an output (Q) terminal of the flip flop 77 is set to High in synchronization with the PWM clock.

When, in each PWM cycle, a counted number of the PWM clocks counted by the PWM counter 82 agrees with a control clock number corresponding to a pulse width which is outputted from a sweep counter 83, the comparator 76 outputs a pulse to a reset (R) terminal of the flip flop 77. At this time, an output signal from the output (Q) terminal of the flip flop 77 is set to Low in synchronization with the PWM clock. This Low state is maintained until a next PWM cycle starts. In the comparator 76, detection of a timing at which a counted number of PWM clocks agrees with the control clock number is performed in synchronization with the PWM clock.

Like this, in the PWM signal generation circuit 41, one duty pulse which means a pulse of a PWM signal is outputted from the output (Q) terminal of the flip flop 77 in every PWM cycle. This operation is repeated by the number of repeat times, so that a PWM signal is outputted to the smoothing circuit 43. For example, in this embodiment where the PWM counter 82 counts 4096 clocks in every PWM cycle, when the number of control clocks outputted from the sweep counter 83 is 1024, a pulse to be outputted from the flip flop 77 has a pulse width corresponding to 1,024 clock (duty 25%) (see FIG. 6). This output of the pulse is repeated during a sampling period which is equal to a predetermined times of PWM cycles.

The PWM controller 42 includes a sweep counter 83 which is a part of a control circuit, a repeat counter 84 which is a part of the control circuit and in addition is a pulse number storage circuit, two temperature PWM duty conversion circuits 85 and 86 which are voltage storage circuits, a comparator 87, a latch circuit 88 which is a part of the control circuit, a PWM duty temperature conversion circuit 89 which is a part of the control circuit, and a voltage rewriting circuit 90. In the PWM controller 42, a maximum temperature signal Smax from the outside is inputted to the temperature PWM duty conversion circuit 85, a minimum temperature signal Smin is inputted to the temperature PWM duty conversion circuit 86, and a repeat-time signal Repeat is inputted to the repeat counter 84. Moreover, a temperature detection signal from the temperature signal generation circuit 40 is inputted to the latch circuit 88. Here, the maximum temperature signal Smax indicates the maximum temperature Tmax in the detection temperature range, and the minimum temperature signal Smin indicates the minimum temperature Tmin in the detection temperature range. The repeat-time signal Repeat indicates the number of times the PWM cycle is repeated in one sampling period. That is, an upper limit and a lower limit of the detection temperature range is determined by the maximum temperature signal Smax and the minimum temperature signal Smin. By changing them, the sweep range of the reference voltage which is the detection temperature range can arbitrarily be changed. The sampling period is determined by the repeat-time signal repeat. By changing this, a sweep period of the reference voltage, that is, a sweep cycle, can be changed.

The repeat counter 84 outputs an increment signal to the sweep counter 83 so as to change the reference voltage step by step from the minimum reference voltage to the maximum reference voltage. The increment signal is outputted in every sampling period. The sampling period is a period in which the PWM cycle is repeated by the number of repeat times which is indicated by the repeat-time signal Repeat thus inputted.

More specifically, the repeat counter 84 stores therein a total number of PWM clocks outputted in each sampling period. The repeat counter 84 counts the number of PWM clocks generated by the PWM clock generation circuit 81. Here, when the total number of PWM clocks stored agrees with a counted number thereof, the repeat counter 84 outputs an increment signal to the sweep counter 83. That is, the increment signal is outputted in every sampling period which is based on the number of pulses from the PWM clock generation circuit 81.

In a case where one sampling period is five times the PWM cycle for example, the PWM clock generation circuit 81 outputs 20480 (=4096*5) PWM clocks to the repeat counter 84 in every sampling period. When the total number of counts of PWM clocks reaches 20480, the repeat counter 84 outputs an increment signal. A counter function of the repeat counter 84 is implemented by a preset-type down counter. A borrow signal, that is, a carry-down signal, of the down counter, which is outputted when the counted number becomes 0, is utilized as the increment signal.

When a borrow signal is outputted, the number of repeat times in a next sampling period is loaded from a not-shown memory means (such as a ROM) to the repeat counter 84 by a not-shown CPU which is a part of the control circuit. In this embodiment, the number of repeat times is fixed. However, the number of repeat times to be loaded may be changed by the CPU. In such a case, a length of the sampling period can be changed. The number of repeat times may be changed depending on a change rate of the detected temperature. For example, when the change rate is high, that is, when a temperature rapidly changes, the number of repeat times is reduced to shorten the sampling period. The change rate is calculated by the CPU.

The temperature PWM duty conversion circuits 85 and 86 determine, based on a temperature signal inputted (Smax, Smin), a pulse width of a PWM signal which corresponds to a temperature indicated by the temperature signal, converts the pulse width into a PWM clock number corresponding to this pulse width, and rewritably stores therein the clocks number thus obtained. Accordingly, the temperature PWM duty conversion circuit 85 converts the inputted maximum temperature signal Smax into a minimum clock number (which corresponds to a value of a first voltage or a first signal level) indicating a pulse width of the PWM signal corresponding to the maximum temperature Tmax in the detection temperature range, and stores it therein. Information about the minimum clock number which is stored in the temperature PWM duty conversion circuit 85 is outputted to the sweep counter 83. On the other hand, the temperature PWM duty conversion circuit 86 converts the inputted minimum temperature signal Smin into a maximum clock number (which corresponds to a value of a second voltage or a second signal level) indicating a pulse width of the PWM signal corresponding to the minimum temperature Tmin in the detection temperature range, and stores it therein. Information about the maximum clock number which is stored in the temperature PWM duty conversion circuit 86 is outputted to the comparator 87.

A rewrite signal from the voltage rewriting circuit 90 is inputted to the temperature PWM duty conversion circuits 85 and 86. The rewrite signal is a temperature signal indicating a temperature. When the rewrite signal is inputted, the temperature PWM duty conversion circuits 85 and 86 perform the same operation as when the temperature signal (Smax, Smin) is inputted.

Here, a brief description will be given to a mechanism by which the temperature PWM duty conversion circuits 85 and 86 convert the temperature signal into a pulse width of the PWM signal. Since temperature-voltage characteristics of the temperature sensor 44 are linear, a relationship between a detected temperature T and an output voltage V can be expressed by an equation: $V=a-bT$. Here, a and b are constants having such values that an output voltage becomes $V=0[v]$ when the maximum temperature Tmax is detected while an output voltage becomes $V=3.3[v]$ when the minimum temperature Tmin is detected. For example, a is 1.341, and b is 0.0042. $V=3.3[v]$ is an output voltage of a logic element which is used for the PWM signal generation circuit 41 of the temperature detection circuit 65. A PWM signal having this voltage value is smoothed so that a reference voltage is made. The output voltage $V=0[v]$ corresponds to a duty 0% of a PWM signal, and the output voltage $V=3.3[v]$ corresponds to a duty 100%. In this embodiment, an arbitrary voltage v existing between 0 and 3.3 is expressed as $3.3*D$ (duty), and thus depends on a duty. When a PWM clock number corresponding to the voltage v is expressed by n, a relationship $D=n/4096$ is established, which leads to an equation $3.3*n/4096=a-bT$. As a result, a relationship $n=c-dT$ (where c and d are constants) is obtained.

Figure 9:
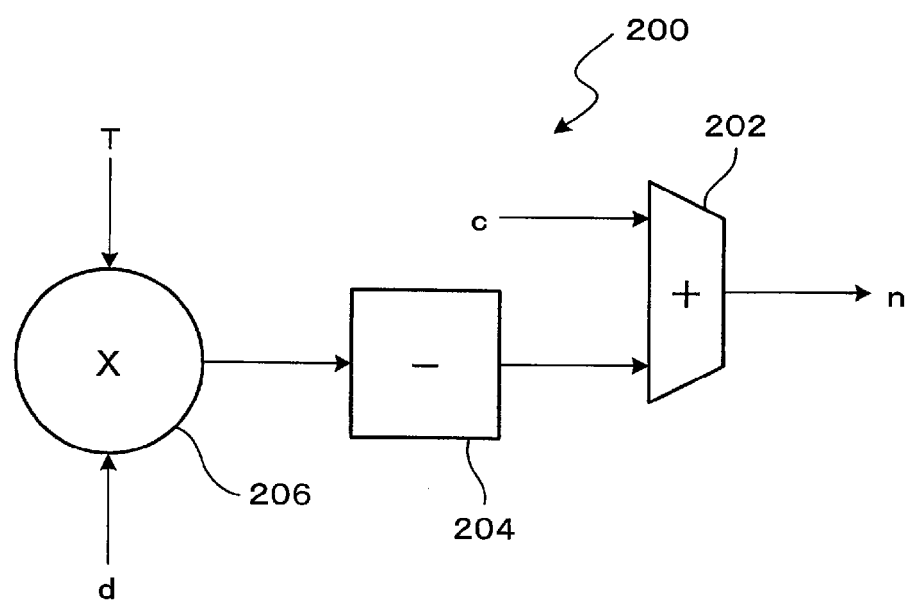
FIG. 9 is a block diagram of a pulse number calculation circuit which is included in a temperature PWM duty conversion circuit shown in FIG. 7.

Each of the temperature PWM duty conversion circuits 85 and 86 has a pulse number calculation circuit 200 made up of an adder circuit 202, a subtractor circuit 204, and a multiplier circuit 206 as shown in FIG. 9. A T value (actually, a temperature signal S corresponding to the T value) and a d value are inputted to the multiplier circuit 206. An output from the multiplier circuit 206 has its sign reversed in the subtractor circuit 204, and is inputted to the adder circuit 202. A c value is inputted to the adder circuit 202, and thus an n value which means a clock number indicating a pulse width of a PWM signal can be obtained. The clock number is temporarily stored in a not-shown memory means (such as a latch circuit) of the temperature PWM duty conversion circuit 85, 86. In the temperature PWM duty conversion circuit 85 to which the maximum temperature signal Smax is inputted, the obtained clock number is stored as the above-described minimum clock number. In the temperature PWM duty conversion circuit 86, the obtained clock number is stored as the maximum clock number.

In this embodiment, every time one sampling period elapses, the PWM controller 42 enlarges a pulse width of a PWM signal by a constant width, and correspondingly the PWM signal generation circuit 41 and the smoothing circuit 43 increase a reference voltage.

The sweep counter 83 derives the number of control clocks to be generated, in accordance with a change rate of the reference voltage. The control clock is used for controlling a pulse width of a PWM signal which is outputted from the PWM signal generation circuit 41. The control clock is outputted from the sweep counter 83 to the comparator 76 of the PWM signal generation circuit 41, the comparator 87, and the latch circuit 88, respectively. When the ink-jet printer 101 is booted up and every time a later-described load signal is outputted from the comparator 87, that is, in every sweep cycle, the minimum clock number outputted from the temperature PWM duty conversion circuit 85 is loaded (LD) as an initial value of the control clock number. Then, every time an increment signal is outputted from the repeat counter 84, the sweep counter 83 increments the control clock number in accordance with the change rate of the reference voltage.

The sweep counter 83 includes an increment calculation circuit which calculates an increment of the control clock number corresponding to the change rate of the reference voltage, that is, a new control clock number at a time when an increment signal is inputted, based on a repeat-time signal Repeat. At a time of bootup, corresponding to a maximum range of the predetermined detection temperature, a predetermined repeat-time signal Repeat is inputted.

The comparator 87 determines a sweep cycle. To be more specific, when the maximum clock number which is outputted from the temperature PWM duty conversion circuit 86 agrees with a control clock number which is outputted from the sweep counter 83, the comparator 87 outputs a load (LD) signal to the sweep counter 83. That is, the comparator 87 outputs a load signal when a control clock number outputted from the sweep counter 83 is incremented to the maximum clock number corresponding to the minimum temperature Tmin of the detection temperature range. At this time, one sweep is completed.

Subsequently, in the sweep counter 83, the minimum clock number outputted from the temperature PWM duty conversion circuit 85 is loaded to the sweep counter 83 again. Consequently, the control clock number outputted from the sweep counter 83 is reset to the minimum clock number. Then, the sweep counter 83 increments a control clock number again based on an increment signal from the repeat counter 84. In an example shown in FIG. 8 where a pulse width increases by 10%, a control clock number increases by about 409 (which nearly equals 4096*0.1) upon every increment.

As a result, as shown in FIG. 8, a reference voltage outputted from the temperature detection circuit 65 sweeps step by step from a minimum voltage 0V to a maximum voltage 3.3V. In other words, the reference voltage sweeps in a region corresponding to the maximum temperature signal Smax to the minimum temperature signal Smin. Like this, the reference voltage sweeps from a voltage corresponding to a higher temperature. This enables the temperature T to be quickly detected in a case where a temperature of the driver IC 52 is high.

When a temperature detection signal is outputted from the temperature signal generation circuit 40 of the driver IC 52, the latch circuit 88 latches information about a control clock number which is outputted from the sweep counter 83. The information about a control clock number thus latched is outputted to the PWM duty temperature conversion circuit 89. The PWM duty temperature conversion circuit 89 converts the information about a control clock number outputted from the latch circuit 88, into a temperature corresponding to a reference voltage which is generated by a PWM signal having pulse widths of this control clock number, that is, into a temperature T of the driver IC 52.

Figure 10:
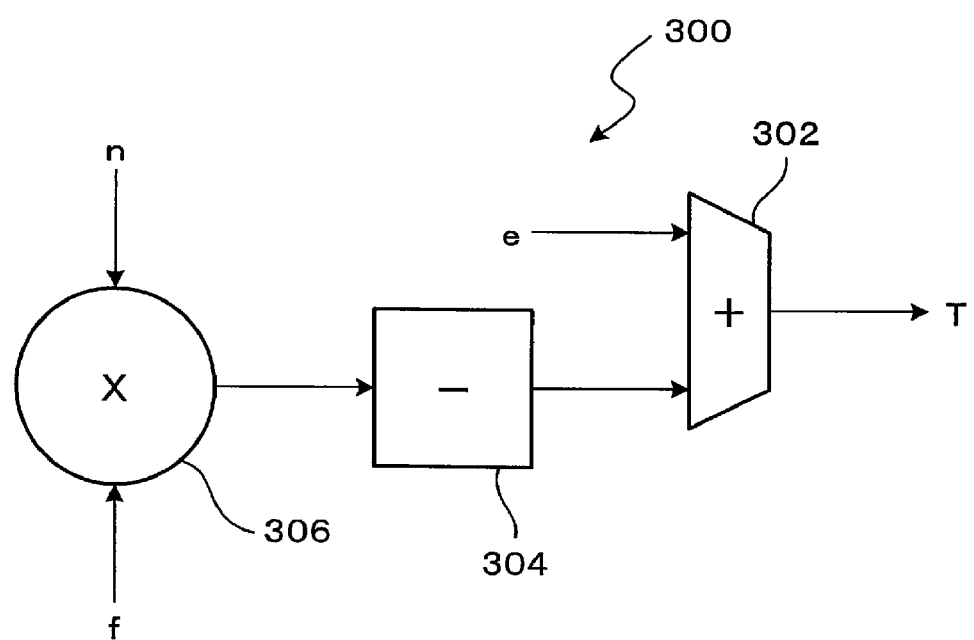
FIG. 10 is a block diagram of a temperature calculation circuit which is included in a PWM duty temperature conversion circuit shown in FIG. 7.

A specific mechanism of this conversion will be described based on a linearity of the temperature sensor 44, like in the above-described mechanism of conversion of the temperature signal into a pulse width of the PWM signal. As described above, the relationship $n=c-dT$ is established between the detected temperature T and the PWM clock number n which indicates a pulse width of the PWM signal. Thus, a relationship $T=e-fn$ (where e and f are constants) is obtained. The PWM duty temperature conversion circuit 89 includes a temperature calculation circuit which has the same structure as that of the temperature PWM duty conversion circuit 85, 86. A structure of the temperature calculation circuit is shown in FIG. 10. As shown in FIG. 10, the temperature calculation circuit 300 includes an adder circuit 302, a subtractor circuit 304, and a multiplier circuit 306. An n value (in this case, an outputted control clock number) and an f value are inputted to the multiplier circuit 306. An output from the multiplier circuit 306 has its sign reversed in the subtractor circuit 304, and is inputted to the adder circuit 302. An e value is inputted to the adder circuit 302, and thus a T value which means a temperature of the driver IC 52 can be obtained.

The temperature T detected by the PWM duty temperature conversion circuit 89 is outputted as a detected temperature signal to the voltage rewriting circuit 90. The detected temperature signal is outputted every time a temperature detection signal is outputted from the temperature signal generation circuit 40 of the driver IC 52. In an example shown in FIG. 8, detected temperature signals indicating detected temperatures 1 to 3, respectively, are sequentially outputted. The detected temperature signal is outputted not only to the voltage rewriting circuit 90 but also to the stopper 66 and the restarter 67.

The voltage rewriting circuit 90 receives the detected temperature signal, and then outputs, to at least either one of the temperature PWM duty conversion circuits 85 and 86, a rewrite signal for changing the minimum clock number and the maximum clock number stored in the temperature PWM duty conversion circuits 85 and 86. The rewrite signal is a signal obtained based on the detected temperature signal, as will be described later.

Detected temperatures in a predetermined number of previous sweeps before a current time point are stored in a not-shown memory means (such as a RAM). By an approximate straight line using the detected temperatures in the predetermined number of sweeps (based on a moving average for example), the voltage rewriting circuit 90 predicts a temperature which will be detected in a next sweep. The voltage rewriting circuit 90 generates a rewrite signal based on a temperature thus predicted.

For example, in a case where the detected temperature increases over time as shown in FIG. 8, a minimum temperature of the rewrite signal is changed sequentially to higher temperatures along with increase in detected temperature. A newly set minimum temperature Tmin may be lower by 20 to 30% than the detected temperature previously measured. In a case where an increment of the control clock number upon every increment is unchanged, the number of sampling during one sweep cycle is reduced. Accordingly, a time required for one sweep is shortened, and in addition a head temperature which means a temperature of the driver IC 52 can be detected at an improved speed. At this time, a resolution of the detected temperature is not changed, because the change rate of the reference voltage does not change.

Increasing the number of repeat times improves the resolution in a sweep. However, if the number of sampling is the same, the sweep period becomes longer. On the other hand, decreasing the number of repeat times deteriorates the resolution in a sweep. However, the sweep period becomes shorter even if the number of sampling times is the same. Here, the number of sampling times becomes smaller. Therefore, even though the number of repeat times is increased due to importance being placed on a resolution, the sweep period does not unnecessarily become longer. In a case where the number of repeat times is reduced due to importance being placed on a detection time, the detection time can further be shortened. In this embodiment, a good balance is realized between maintaining a resolution and shortening a detection time.

The voltage rewriting circuit 90 predicts a detected temperature in a next sweep period based on one or more previous detected temperature signals before a current point. Then, the voltage rewriting circuit 90 sets a range which sufficiently covers a predicted value, to minimum and maximum temperatures in the next sweep. As a result, a temperature range for sweeping is narrowed. Then, the voltage rewriting circuit 90 generates a rewrite signal indicating a changed temperature for at least either one of the minimum temperature and the maximum temperature.

Thus, by grasping the detected temperatures in a chronological order, a temperature T which will be detected in a next sweep can be predicted, so that a corresponding detected temperature range is narrowed. That is, based on the temperature T detected, at least either one of a new maximum temperature (which corresponds to a minimum clock number stored in the temperature PWM duty conversion circuit 85) and a new minimum temperature (which corresponds to a maximum clock number stored in the temperature PWM duty conversion circuit 86) is determined so as to be suitable for a predicted value of the temperature T. Thereby, a next range in which a reference voltage sweeps can be narrowed.

As described above, the voltage rewriting circuit 90 changes a temperature detection range, based on a detection result of a head temperature by the temperature sensor 44. When the detection result indicates a rising tendency of the temperature, the minimum temperature which determines a detection range is changed to sequentially higher temperatures, to thereby narrow a detection range. As a consequence, a sweep cycle is shortened, and a temperature detection time is also shortened. This can prevent thermal destruction of the driver IC 52 beforehand. This can be applied also when the detection result indicates a falling tendency of the temperature. In a case where the temperature once rises and then falls, the minimum temperature is changed to sequentially lower temperatures. If the temperature shows a falling tendency at a time of bootup, the maximum temperature which determines a detection range is changed to sequentially lower temperatures. In general, as a temperature drops, ink viscosity increases to deteriorate ejection characteristics. When a lower limit temperature within a temperature range in which appropriate ejection characteristics are exhibited is represented by Tlow, it can be detected in a short time that the head temperature has reached the temperature Tlow. When this is detected, the CPU may issue a warning to a user by a not-shown display means, and at the same time stop driving of the driver IC 52.

Figure 11:
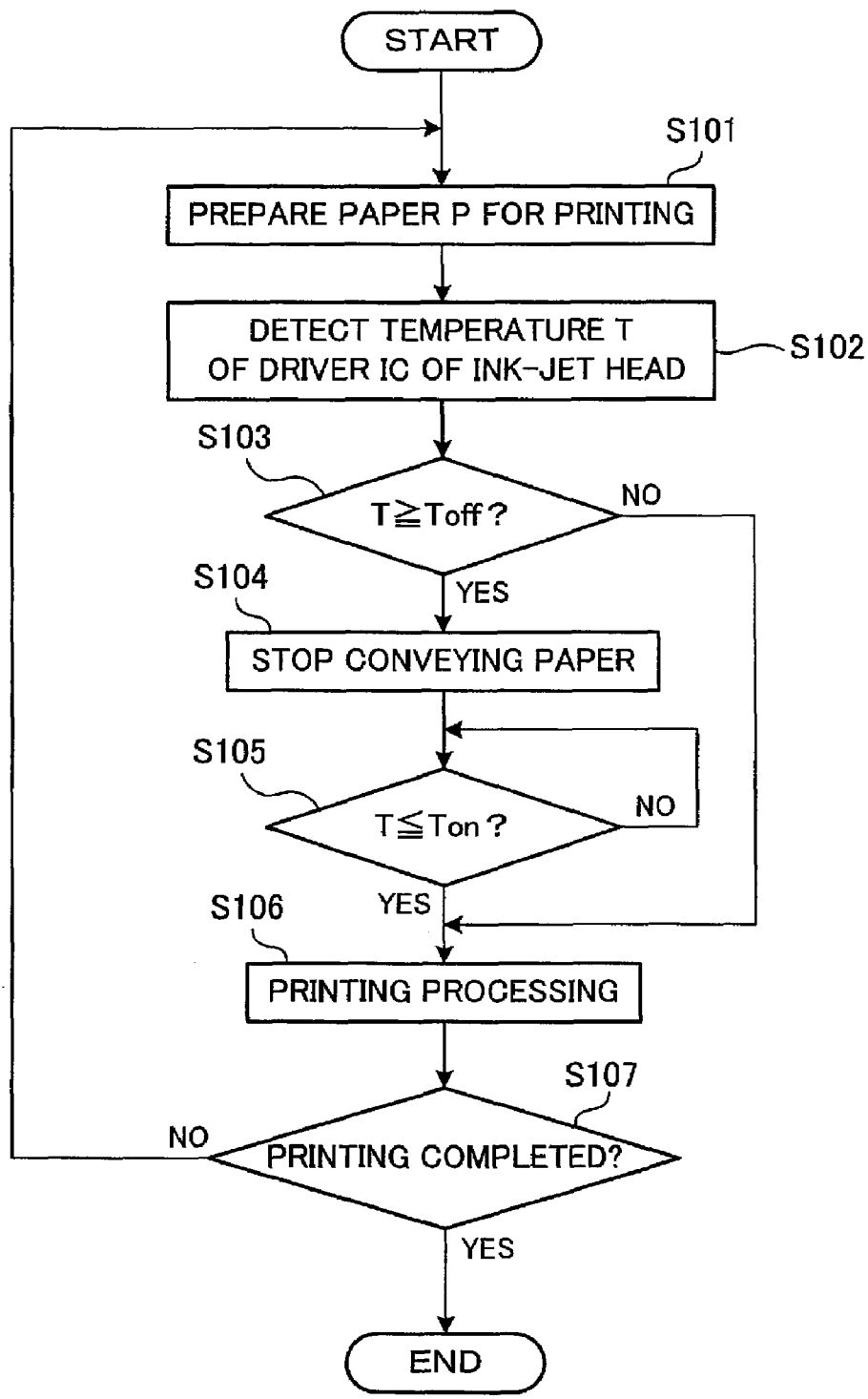
FIG. 11 is a flowchart showing an operation of the controller shown in FIG. 1.

Next, an operation of the controller 16 will be described with reference to FIG. 11. FIG. 11 is a flowchart showing an operation of the controller 16. As shown in FIG. 11, when printing is started, a processing goes to a step S101 (hereinafter referred to as S101 which applies to all the other steps) in which, as preparations for printing, the placement controller 69 drives the pick-up roller 11c so as to place a paper P at the printing standby position A. Then, in S102, the temperature detection circuit 65 detects a temperature T of the driver IC 52 of the ink-jet head 1.

Then, in S103, when the temperature detection circuit 65 does not detect a temperature T equal to or higher than the upper limit temperature Toff (S103: NO), the processing goes to S106. When the temperature detection circuit 65 detects a temperature T equal to or higher than the upper limit temperature Toff (S103: YES), the processing goes to S104 in which the stopper 66 stops driving of the driver IC 52 driven by the driver 64 and at the same time the conveyor motor controller 68 stops the conveyor belt 8. Then, in S105, when the temperature detection circuit 65 does not detect a temperature T equal to or lower than the restart temperature Ton (S105: NO), the temperature detection circuit 65 waits until it detects a temperature T equal to or lower than the restart temperature Ton. When the driver IC is self-cooled and the temperature detection circuit 65 detects a temperature T equal to or lower than the restart temperature Ton (S105: YES), the processing goes to S106.

In S106, a printing processing on a next paper P is performed. At this time, when driving of the driver IC 52 is being stopped by the stopper 66, the restarter 67 restarts driving of the driver IC 52. In performing the printing processing, the placement controller 69 drives the pick-up roller 11c at a predetermined timing so as to place the paper P waiting in the printing standby position A onto the outer surface 8a of the conveyor belt 8. When the printing processing is completed, the processing goes to S107 in which whether all printing is completed or not is determined. When the printing is not completed (S107: NO), the processing goes to S101 to repeat the above-described steps for a printing processing on a next paper P. When the printing is completed (S107: YES), the processing shown by the flowchart of FIG. 11 is completed.

According to this embodiment described above, a temperature of the driver IC 52 can be detected in real time, and at least either one of the minimum clock number and the maximum clock number stored in the temperature PWM duty conversion circuits 82 and 86 is changed based on a rewrite signal outputted from the voltage rewriting circuit 90, so that a range of change in voltage of the reference signal is easily changed to an appropriate range which is close to a voltage of the output signal of the temperature sensor 44. This can efficiently shorten the sweep period, and improve responsiveness in temperature detection.

Further, a change rate of the reference voltage can be changed by changing the repeat-time signal Repeat which is inputted to the repeat counter 84. As a result, the sampling period becomes shorter, and the sweep period is further efficiently shortened.

The temperature detection circuit 65 is made up of the PWM signal generation circuit 41 which generates the PWM signal, a smoothing circuit 43 which smoothes the PWM signal to generate a reference voltage, and the PWM controller 42 which modulates a pulse width of the PWM signal. Accordingly, the temperature detection circuit 65 can be formed at low costs. Moreover, the voltage change rate of the reference signal can easily be changed by rewriting a value of the number of pulses which is stored in the repeat counter 84. As a result, further higher responsiveness in temperature detection can be obtained.

Second Embodiment

Figure 12:
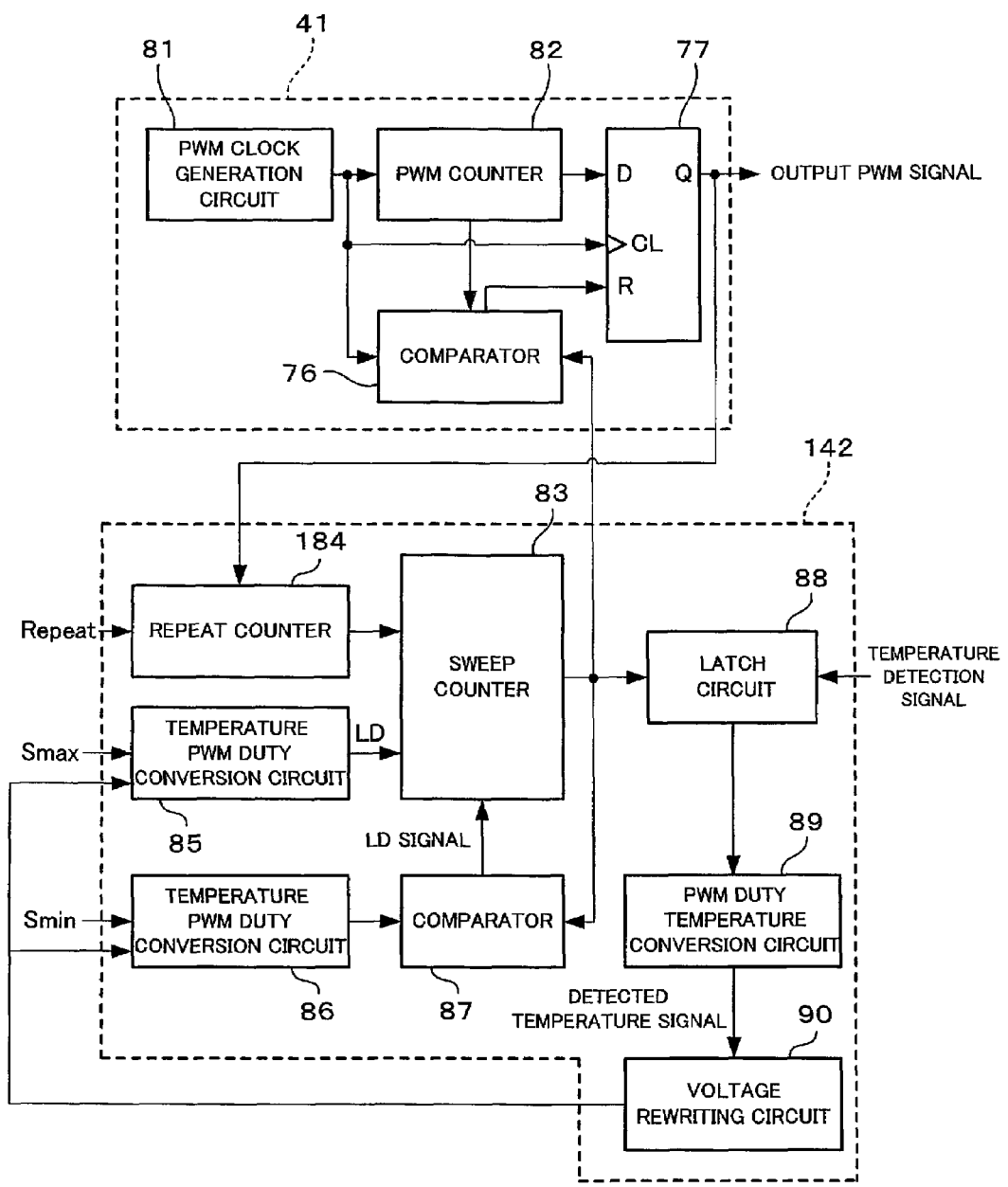
FIG. 12 is a block diagram for explaining a PWM controller according to a second embodiment of the present invention.

Next, a second embodiment of the present invention will be described with reference to FIG. 12. FIG. 12 is a block diagram of a PWM signal generation circuit 41 and a PWM controller 142. The second embodiment differs from the first embodiment only in a repeat counter 184 of the PWM controller 142. In the following, therefore, a description will be given mainly to the repeat counter 184, and the other parts of the ink-jet printer and the temperature detector will be denoted by the same reference numerals as in the first embodiment, without specific descriptions thereof.

The repeat counter 184 outputs an increment signal to a sweep counter 83 so as to change a reference voltage step by step from a minimum reference voltage to a maximum reference voltage by the number of repeat times which is indicated by a repeat-time signal Repeat inputted. The increment signal is outputted in every sampling period which is based on the number of PWM pulses.

More specifically, the repeat counter 184 stores therein the number of PWM cycles included in each sampling period. As shown in FIG. 12, the repeat counter 184 counts the number of pulses outputted from a Q terminal of a flip flop 77. A counter function of the repeat counter 184 is implemented by a preset-type down counter. For example, when an output signal from the Q terminal switches from Low to High, that is, every time the PWM period is started, the repeat counter 184 counts down from an initial pulse number. When a counted number becomes 0, a borrow signal of the down counter is outputted as an increment signal to the sweep counter 83.

In a case where the sampling period is five times the PWM cycle for example, five pulses are outputted from the Q terminal of the flip flop 77 in every sampling period. When the repeat counter 184 counts down five pulses, the repeat counter 184 outputs an increment signal to the sweep counter 83. When a borrow signal is outputted, the number of repeat times in a next sampling period is loaded from a not-shown memory means (such as a ROM) to the repeat counter 184 by a not-shown CPU which is a part of a control circuit. In this embodiment, the number of repeat times is fixed. However, the number of repeat times to be loaded may be changed by the CPU. In such a case, a length of the sampling period can be changed. The number of repeat times may be changed depending on a change rate of a detected temperature. For example, when the change rate is high, that is, when a temperature rapidly changes, the number of repeat times is reduced to shorten the sampling period. The change rate is calculated by the CPU.

The sweep counter 83 is a preset counter which counts the number of control clocks for controlling a pulse width of the PWM signal outputted from the PWM signal generation circuit 41 in accordance with a predetermined change rate of the reference voltage.

At a time when the ink-jet printer 101 is booted up, a minimum clock number outputted from a temperature PWM duty conversion circuit 85 is preset as an initial value of a control clock number in the sweep counter 83. Then, every time an increment signal is outputted from the repeat counter 184, the sweep counter 83 counts up the control clock number in accordance with the change rate of the reference voltage. In an example shown in FIG. 8, a control clock number which is greater than in the previous sampling by approximately 409 is counted up upon every increment operation.

A counted number of the sweep counter 83, that is, a control clock number, is outputted to a comparator 76. When the control clock number agrees with a counted number of a PWM counter 82, the flip flop 77 is reset to Low. A Low period is maintained until the PWM counter 82 counts 4096 pulses which correspond to one PWM period. As a result, a waveform corresponding to one PWM period of the PWM signal having a predetermined duty is formed.

In addition, a control clock is outputted from the sweep counter 83 to a latch circuit 88 and a comparator 87. When a maximum clock number (corresponding to Smin) which is stored in the temperature PWM duty conversion circuit 86 agrees with a control clock number from the sweep counter 83, the comparator 87 outputs an LD signal to the sweep counter 83. At this time, a minimum clock number (corresponding to Smax) which is stored in the temperature PWM duty conversion circuit 85 is preset in the sweep counter 8. again. Thereby, a duty of the PWM signal repeatedly sweeps within a range from Smax to Smin. On the other hand, when a temperature detection signal is outputted from the temperature signal generation circuit 40 to the latch circuit 88, a current control clock number from the sweep counter 83 is latched. The latched control clock number is converted into a temperature value by the PWM duty temperature conversion circuit 89, and outputted as a detected temperature to the outside.

According to this embodiment described above, a temperature of the driver IC 52 can be detected in real time, and at least either one of the minimum clock number and the maximum clock number stored in the temperature PWM duty conversion circuits 82 and 86 is changed based on a rewrite signal outputted from the voltage rewriting circuit 90, so that a range of change in voltage of the reference signal is easily changed to an appropriate range which is close to a voltage of the output signal of the temperature sensor 44.

In the first and second embodiments, the change rate of the reference voltage is changed by changing the repeat-time signal Repeat which is inputted to the repeat counter 84. However, a change rate of the reference voltage may be fixed.

In the first and second embodiments, the temperature detection circuit 65 changes the reference voltage by modulating a pulse width of the PWM signal. However, it may be possible that the temperature detection circuit uses another circuit which changes the reference voltage. For example, the reference voltage may be changed by use of a converter. Thereby, the reference voltage can be accurately controlled, and therefore further higher responsiveness in temperature detection can be obtained.

Third Embodiment

Figure 13:
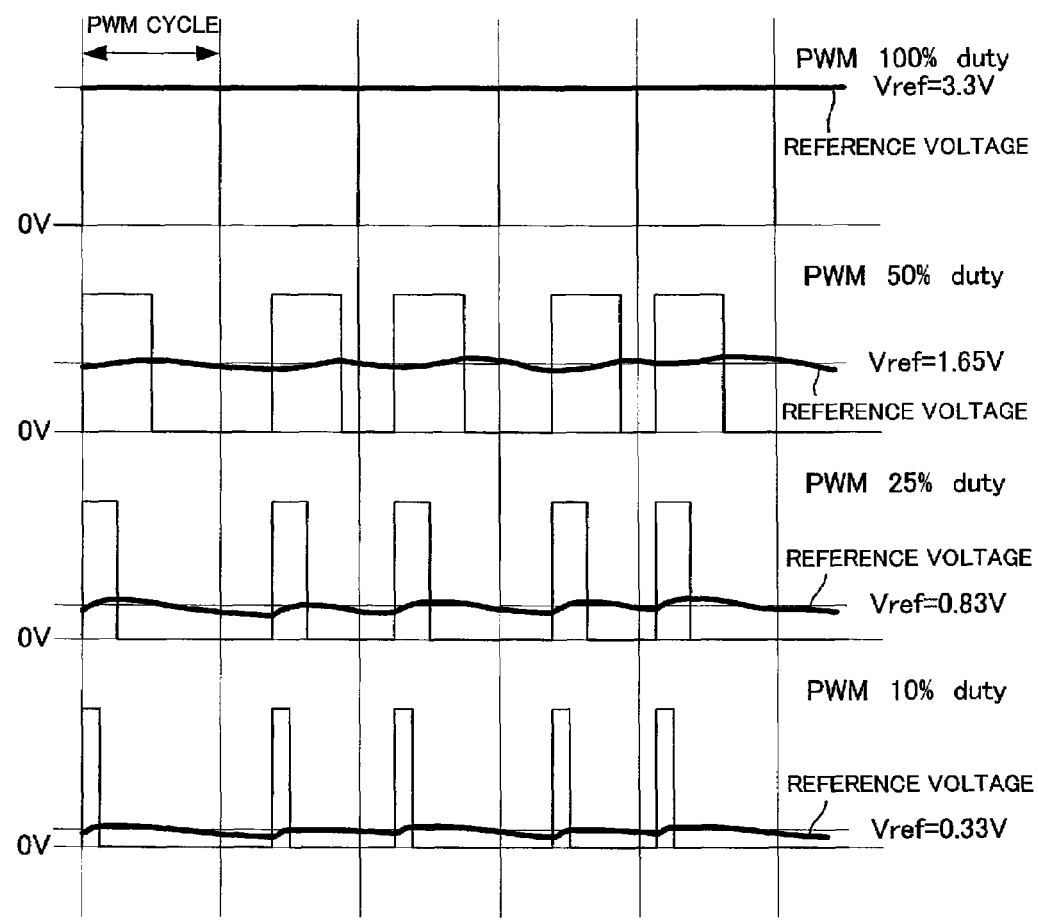
FIG. 13 shows a relationship a reference voltage and a PWM signal outputted from a PWM signal generation circuit in a third embodiment of the present invention.
Figure 14:
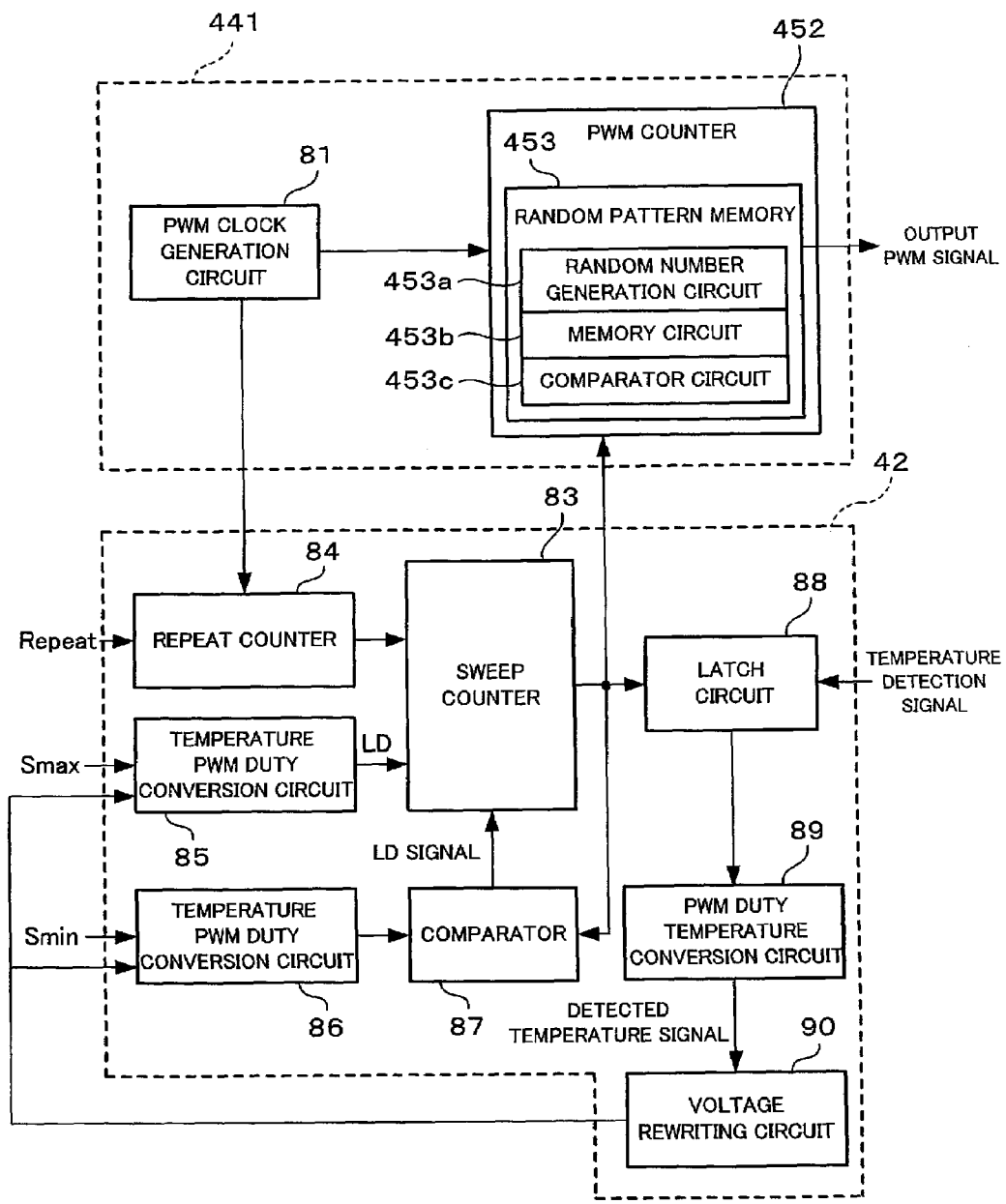
FIG. 14 is a block diagram of the PWM signal generation circuit and a PWM controller according to the third embodiment of the present invention.
Figure 15:
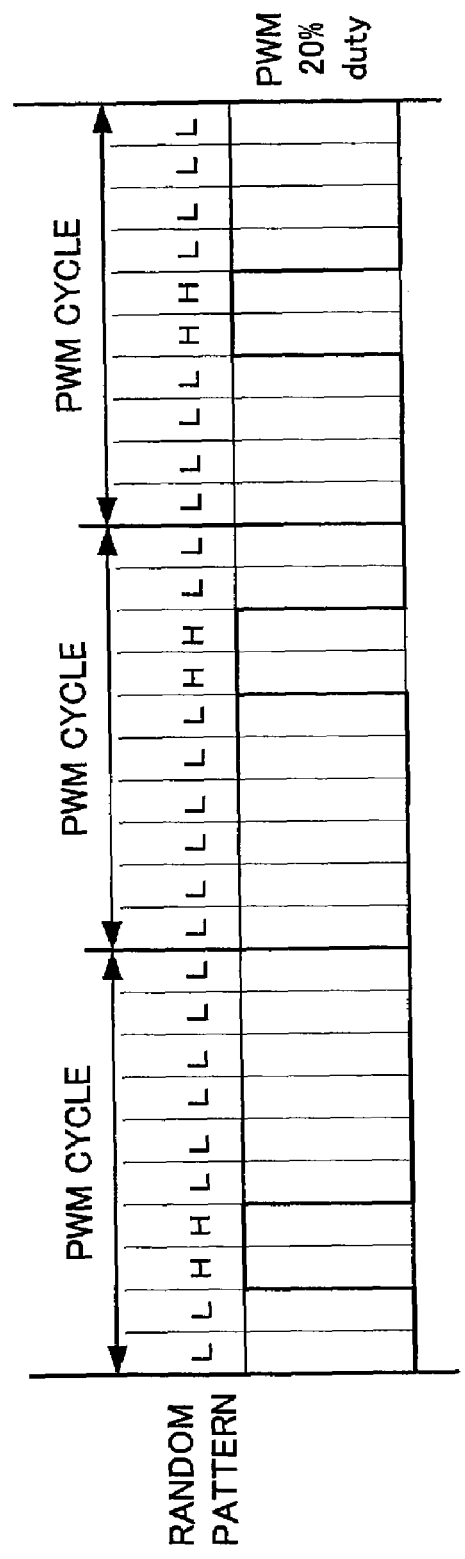
FIG. 15 is a view for explaining a PWM signal which is generated by the PWM signal generation circuit in the third embodiment of the present invention.

Next, a third embodiment of the present invention will be described with reference to FIGS. 13 to 15. FIG. 13 is a view showing this embodiment and corresponding to FIG. 6 for the first embodiment. FIG. 14 is a block diagram of a PWM signal generation circuit 441 and a PWM controller 42 which form a temperature detector of this embodiment. FIG. 15 is a view for explaining a PWM signal which is generated by the PWM signal generation circuit 441. This embodiment differs from the first embodiment only in the PWM signal generation circuit 441. In the following, therefore, a description will be given mainly to the PWM signal generation circuit 441, and the other parts of the ink-jet printer and the temperature detector will be denoted by the same reference numerals as in the first embodiment, without specific descriptions thereof.

In this embodiment, the PWM signal generation circuit 441 generates a Pulse Width Modulation (PWM) having only a single pulse within a predetermined PWM cycle. FIG. 13 shows a relationship between a PWM signal which is outputted from the PWM signal generation circuit 441 and a reference voltage (Vref) which is obtained by smoothing the PWM signal. In examples shown in FIG. 13, a pulse width which means a duty is 100%, 50%, 25%, and 10%. In each PWM cycle, the PWM signal generation circuit 441 generates such a PWM signal that a high-level position of a pulse is random. As a result, there are a plurality of kinds of patterns for a period during which the PWM signal generated by the PWM signal generation circuit 441 is maintained at a high level. The same duty means that a pulse width of a pulse is the same, that is, a period during which the pulse is kept at a high level is the same. The PWM signal generated by the PWM signal generation circuit 441 is outputted to a smoothing circuit 43.

The PWM controller 42 modulates a pulse width of a PWM signal which is generated by the PWM signal generation circuit 441, and in addition detects a temperature T of a driver IC 52. A temperature of the driver IC 52 is determined based on a pulse width of the PWM signal at a timing when a temperature detection signal from the temperature signal generation circuit 40 changes from a low level to a high level. The detected temperature T is outputted as a detected temperature signal. An operation of the PWM controller 42 is the same as described in the first embodiment.

The PWM controller 42 modulates a pulse width of the PWM signal, so that the reference voltage is changed as shown in FIG. 13. The PWM signal is a pulse train including a plurality of pulses having the same pulse width. A period during which the plurality of pulses having the same pulse width continue is equivalent to a sampling period which means a period during which one step is maintained in the reference voltage shown in FIG. 8. In this embodiment, there are the same number of pulses in any sampling period. There are a plurality of kinds of pulse intervals in the sampling period. Every time one sampling period ends, pulse widths of pulses which are sequentially outputted from the PWM signal generation circuit 441 are changed, and more specifically they are gradually increased or decreased. Consequently, the reference voltage changes step by step within a predetermined voltage range. When the reference voltage finishes changing from an upper limit to a lower limit or from a lower limit to an upper limit within a voltage range corresponding to the detection temperature range, one sweep operation is completed. Here, a time length required for one sweep operation will be referred to as "one sweep cycle".

As shown in FIG. 14, the PWM signal generation circuit 441 includes a PWM clock generation circuit 81 and a PWM counter 452. The PWM clock generation circuit 81 is a circuit which generates a PWM clock which means a reference clock for the PWM signal generated by the PWM signal generation circuit 441. A reference clock generated by the PWM clock generation circuit 81 is outputted to a PWM counter 452 and a repeat counter 84 of the PWM controller 42. In this embodiment, the PWM clock generation circuit 81 generates 4096 reference clocks at the maximum in every PWM cycle.

In each PWM cycle, the PWM counter 452 generates one pulse which is maintained at High (high level) for a time period corresponding to the number of control clocks outputted from the sweep counter 83 which will be described later.

The PWM counter 452 has a random pattern memory 453. The random pattern memory 453 has a random number generation circuit 453a, and a memory circuit 453b which is a random number memory and temporarily stores therein an output from the random number generation circuit 453a. The random pattern memory 453 further has a high-low comparator circuit 453c which compares information stored in the memory circuit 453b with an output from the random number generation circuit 453a. The random number generation circuit 453a generates a high-low (HL) pattern for one pulse of a PWM signal, so as to correspond to the number of control clocks outputted from the sweep counter 83 (which corresponds to a duty of the PWM signal). The memory circuit 453b stores therein an HL pattern generated by the random number generation circuit 453a in just one previous PWM cycle.

As shown in FIG. 15, the PWM signal is such a signal that a high-level period in each PWM cycle is randomly placed. A random pattern is made up of pulses for a plurality of PWM cycles which constitute one sampling period. In FIG. 15, a reference character "H" indicates a high-level period, and a reference character "L" indicates a low-level period. In each random pattern, each pulse included in the PWM signal continues to be at the high level for the number of control clocks. FIG. 15 shows a part of a random pattern of the PWM signal in a case where the duty is 20%. In the random pattern shown in FIG. 15, one PWM cycle is made up of ten reference blocks, and a high level occurs in two continuous reference blocks. In this embodiment, a period for one reference block corresponds to about 409 control pulses (duty 10%).

The random number generation circuit 453a of the random pattern memory 453 generates an HL pattern signal in which a high-level period is randomly placed in accordance with the control clock number. The HL pattern signal is generated in every PWM cycle, so that the PWM counter 452 generates a PWM signal including a plurality of pulse intervals.

The immediately previous HL pattern signal is stored in the memory circuit 453b. The high-low comparator circuit 453c compares a code of the HL pattern signal in the last block of the immediately previous PWM cycle with a code of the HL pattern signal in the first block of the current PWM cycle. When it is determined that both of the codes indicate the high level, the random number generation circuit generates an HL pattern again. This regeneration of the HL pattern is repeated until the high-low comparator circuit 453c determines that codes are not identical. As a result, in the PWM signal generated by the PWM counter 452, a high level in a PWM cycle is not continuous with a high level in an adjacent PWM cycle. Therefore, a ripple of the reference voltage can be suppressed. In each random pattern, the high-level period "H" does not continue across two adjacent PWM cycles, except when the duty is 100%.

The temperature T detected by the PWM duty temperature conversion circuit 89 is outputted as a detected temperature signal to the voltage rewriting circuit 90. The voltage rewriting circuit 90 receives the detected temperature signal, and then outputs, to at least either one of the temperature PWM duty conversion circuits 85 and 86, a rewrite signal for changing the minimum clock number and the maximum clock number stored in the temperature PWM duty conversion circuits 85 and 86. The rewrite signal is, like in the first embodiment. a signal obtained based on the detected temperature signal.

According to this embodiment described above, the PWM counter 452 of the PWM signal generation circuit 441 generates a PWM signal which presents a plurality of patterns of periods during which the PWM signal is maintained at the high level in the PWM cycle. Therefore, a spectrum of the PWM signal is dispersed. By optimizing the smoothing circuit 43 in accordance with a pulse cycle which corresponds to a spectrum dispersed in a higher frequency, a time constant of the smoothing circuit 43 can be made smaller while suppressing occurrence of a ripple. Consequently, a phase lag of the reference voltage can be suppressed. Therefore, responsiveness in temperature detection can be improved while suppressing deterioration in temperature detection accuracy.

In addition, since the PWM counter 452 generates the PWM signal with reference to the HL pattern which is generated by the random number generation circuit 453a of the random pattern memory 453, a structure of the PWM counter can be simplified.

Moreover, the high-level period "H" does not continue across two adjacent PWM cycles, except when the duty is 100%. Accordingly, load on a power supply circuit can be reduced, and in addition influence of a ripple can be reduced, too.

Further, since the PWM counter 452 generates a pulse including one randomly-placed high-level point in every PWM cycle, spectra of the PWM signal made up of such a pulse is uniformly dispersed. This can suppress partial enlarging of a ripple of the reference voltage.

Figure 16:
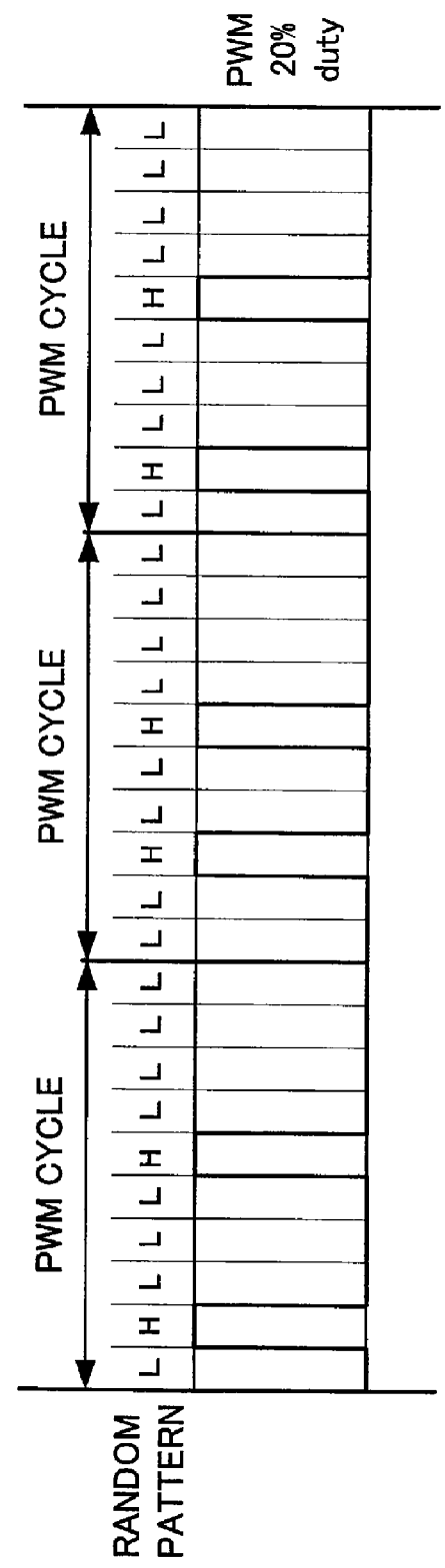
FIG. 16 is a view for explaining a modification of the third embodiment of the present invention.

In this embodiment, the PWM counter 452 generates a PWM signal having one pulse randomly placed in each PWM cycle. However, the PWM counter 452 may generate a PWM signal having two pulses randomly placed in each PWM cycle, as shown in FIG. 16. Further, it may also be possible that a pulse pattern (random pattern) for the PWM counter 452 to generate three or more pulses randomly placed in each PWM cycle is stored in the random pattern memory 453. In any case, like in the above-described example, it is preferable that high levels in adjacent PWM cycles are not continuous with each other. Thereby, a spectrum of the PWM signal generated by the PWM signal generation circuit can surely be shifted to a high-frequency side. Therefore, a time constant of the smoothing circuit can be made further smaller while suppressing occurrence of a ripple of the reference voltage. Consequently, responsiveness in temperature detection can be further improved.

In the third embodiment, the PWM counter 452 generates a PWM signal in each PWM cycle of which one pulse is randomly placed. However, the PWM counter 452 may generate a PWM signal in which an arbitrary number of pulses are placed, as long as a total high-level period in any PWM cycle is the same and in addition there are at least two kinds of high-level period patterns in each PWM cycle. In the third embodiment, the temperature detector may not necessarily include the voltage rewriting circuit 90.

In the third embodiment, moreover, the PWM counter 452 generates a PWM signal with reference to the HL pattern generated by the random number generation circuit, but the PWM counter 452 may generate a PWM signal by other systems, such as generating a PWM signal with reference to the random pattern memory 453 and a random number table stored separately and in accordance with a pattern which is determined in real time.

In the third embodiment, in addition, the change rate of the reference voltage is changed by changing the repeat-time signal Repeat which is inputted to the repeat counter 84. However, a change rate of the reference voltage may be fixed.

Further, in the above-described three embodiments, the actuator unit 21 is a unimorph-type actuator. However, other actuators which apply ejection energy to pressure chambers may be employed.

In the above-described three embodiments, the present invention is applied to the ink-jet printer 101, and the temperature detection circuit 65 detects a temperature T of the driver IC 52 of the ink-jet head. However, the present invention is applicable to any apparatus which needs temperature detection.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A temperature detector comprising:
a temperature sensor, an output signal of which changes in level in accordance with change in temperature of a detection object;
a reference signal generation circuit which generates a level-changeable reference signal;
a level memory which rewritably stores therein a first signal level and a second signal level which determine a range where a level of the reference signal changes;
a control circuit which controls the reference signal generation circuit so as to make a level of the reference signal change from the first signal level to the second signal level stored in the level memory;
a comparator circuit which compares the level of the reference signal and a level of the output signal; and
a level rewriter which rewrites at least either one of the first signal level and the second signal level stored in the level memory,
wherein the control circuit determines that the level of the reference signal has reached the level of the output signal in accordance with a result of comparison at the comparator circuit and generates, as a detected temperature signal indicating a current temperature of the detection object, a signal corresponding to the level of the reference signal generated by the reference signal generation circuit at a time when the level of the reference signal reaches the level of the output signal, and in addition the control circuit controls the level rewriter so as to change a range where a level of the reference signal changes in accordance with the signal indicating a temperature of the detection object.

2. The temperature detector according to claim 1, wherein:
the reference signal generation circuit includes a pulse signal generation circuit which generates a pulse signal of a predetermined cycle, and a smoothing circuit which smoothes the pulse signal generated by the pulse signal generation circuit and outputs the smoothed pulse signal as the reference signal; and
the control circuit changes a voltage of the reference signal by modulating a pulse width of the pulse signal generated by the pulse signal generation circuit.

3. The temperature detector according to claim 2, wherein:
the control circuit includes
a counter which counts the number of pulses of the pulse signal while the pulse signal generation circuit is generating the pulse signal having a constant pulse width, and
a pulse number memory circuit which stores therein the number of pulses regarding the pulse signal; and
the control circuit modulates a pulse width of the pulse signal every time a value of the counter agrees with the number of pulses stored in the pulse number memory circuit.

4. The temperature detector according to claim 1, wherein the reference signal generation circuit is a D/A converter.

5. The temperature detector according to claim 1, wherein:
the first signal level is associated with a maximum temperature in a detected temperature range;
the second signal level is associated with a minimum temperature in the detected temperature range; and
when the control circuit determines that a temperature of the detection object tends to rise based on temperatures detected in the past, the control circuit changes the second signal level so as to raise the minimum temperature.

6. The temperature detector according to claim 1, wherein:
the control circuit includes
a sweep counter which counts the number of signals each having a predetermined cycle, and
a latch circuit which stores and keeps therein count contents of the sweep counter at a time when the level of the reference signal reaches the level of the output signal;
the first signal level is loaded as an initial value to the sweep counter, and, when count contents of the sweep counter reaches the second signal level, the first signal level is loaded as an initial value to the sweep counter again; and
the control circuit generates a signal corresponding to contents stored and kept in the latch circuit as the detected temperature signal.

7. The temperature detector according to claim 6, wherein:
a sweep cycle from a time corresponding to the first signal level to a time corresponding to the second signal level is made up of a plurality of sampling periods each of which is made up of a plurality of pulse width modulation cycles each including a plurality of the predetermined cycles; and
the sweep counter counts the number of the signals each having the predetermined cycle which are generated in the sampling period.

8. The temperature detector according to claim 7, wherein:
the control circuit includes a repeat counter which counts the number of clocks each having a pulse width modulation cycle or a constant repeating cycle which is shorter than the pulse width modulation cycle; and
the number of pulse width modulation cycles, the total time of which is equal to the sampling period, can be set in the repeat counter, and, when the number counted by the repeat counter reaches the number set in the repeat counter, the repeat counter supplies an increment signal to the sweep counter.

9. A temperature detector comprising:
a temperature sensor, an output signal of which changes in level in accordance with change in temperature of a detection object;
a reference signal generation circuit which generates a level-changeable reference signal;
a level memory which rewritably stores therein a first signal level and a second signal level which determine a range where a level of the reference signal changes;
a control circuit which controls the reference signal generation circuit so as to make a level of the reference signal change from the first signal level to the second signal level stored in the level memory; and
a comparator circuit which compares the level of the reference signal and a level of the output signal,
wherein:
the reference signal generation circuit includes
a pulse signal generation circuit which generates a pulse signal having a predetermined cycle, the pulse signal being generated in a sampling period which is made up of a plurality of the predetermined cycles, in such a manner that a total high-level period of the pulse signal in any of the predetermined cycles is the same and there are two or more kinds of patterns of periods during which the pulse signal is maintained at a high level in the predetermined cycle, and
a smoothing circuit which smoothes the pulse signal generated by the pulse signal generation circuit and outputs the smoothed pulse signal as the reference signal; and
the control circuit changes a voltage of the reference signal within a range from the first signal level to the second signal level by changing a total high-level period of the pulse signal generated by the pulse signal generation circuit within each of the predetermined cycles on a sampling period basis as a unit, and the control circuit determines that the level of the reference signal has reached the level of the output signal in accordance with a result of comparison at the comparator circuit and generates, as a detected temperature signal indicating a current temperature of the detection object, a signal corresponding to the level of the reference signal generated by the reference signal generation circuit at a time when the level of the reference signal reaches the level of the output signal.

10. The temperature detector according to claim 9, wherein the pulse signal generation circuit generates a pulse signal having one pulse randomly placed within the predetermined cycle.

11. The temperature detector according to claim 10, wherein:
the pulse signal generation circuit includes a random number generation circuit which generates a random number; and
the pulse signal generation circuit determines a position or positions of the one or the plurality of pulses within the predetermined cycle, based on an output from the random number generation circuit.

12. The temperature detector according to claim 9, wherein the pulse signal generation circuit generates a pulse signal having a plurality of pulses randomly placed within the predetermined cycle.

13. The temperature detector according to claim 12, wherein:
the pulse signal generation circuit includes a random number generation circuit which generates a random number; and
the pulse signal generation circuit determines a position or positions of the one or the plurality of pulses within the predetermined cycle, based on an output from the random number generation circuit.

14. The temperature detector according to claim 9, further comprising a level rewriter which rewrites at least either one of the first signal level and the second signal level stored in a voltage memory circuit.

15. The temperature detector according to claim 9, wherein:
the pulse signal generation circuit includes
a random number generator which generates a signal indicating a high-low pattern in which a plurality of high-level periods which correspond to a high level in the pulse signal are randomly placed in the predetermined cycle,
a random number memory which temporarily stores therein a signal generated by the random number generator, and
a high-low comparator circuit which compares a code at a last part of a signal stored in the random number memory and a code at a first part of a signal newly generated by the random number generator; and when the high-low comparator circuit determines that both of the code at the last part and the code at the first part are a high level sign, the random number generator further newly generates a signal indicating the high-low pattern.

16. The temperature detector according to claim 9, wherein;

the control circuit includes a sweep counter which counts the number of signals each having a predetermined cycle, and a latch circuit which stores and keeps therein count contents of the sweep counter at a time when the level of the reference signal reaches the level of the output signal;

the first signal level is loaded as an initial value to the sweep counter, and, when count contents of the sweep counter reaches the second signal level, the first signal level is loaded as an initial value to the sweep counter again; and the control circuit generates a signal corresponding to contents stored and kept in the latch circuit as the detected temperature signal.

17. The temperature detector according to claim 16, wherein:

a sweep cycle from a time corresponding to the first signal level to a time corresponding to the second signal level is made up of a plurality of sampling periods each of which is made up of a plurality of pulse width modulation cycles each including a plurality of the predetermined cycles; and the sweep counter counts the number of the signals each having the predetermined cycle which are generated in the sampling period.

18. The temperature detector according to claim 16, wherein:

the control circuit includes a repeat counter which counts the number of clocks each having a pulse width modulation cycle or a constant repeating cycle which is shorter than the pulse width modulation cycle; and the number of pulse width modulation cycles, the total time of which is equal to the sampling period, can be set in the repeat counter, and, when the number counted by the repeat counter reaches the number set in the repeat counter, the repeat counter supplies an increment signal to the sweep counter.

19. A recording apparatus comprising:

a recording head which records an image on a recording medium;

a temperature sensor, an output signal of which changes in level in accordance with change in temperature of the recording head;

a reference signal generation circuit which generates a level-changeable reference signal;

a level memory which rewritably stores therein a first signal level and a second signal level which determine a range where a level of the reference signal changes;

a control circuit which controls the reference signal generation circuit so as to make a level of the reference signal change from the first signal level to the second signal level stored in the level memory;

a comparator circuit which compares the level of the reference signal and a level of the output signal; and a level rewriter which rewrites at least either one of the first signal level and the second signal level stored in the level memory, wherein the control circuit determines that the level of the reference signal has reached the level of the output signal in accordance with a result of comparison at the comparator circuit and generates, as a detected temperature signal indicating a current temperature of the recording head, a signal corresponding to the level of the reference signal generated by the reference signal generation circuit at a time when the level of the reference signal reaches the level of the output signal, and in addition the control circuit controls the level rewriter so as to change a range where a level of the reference signal changes in accordance with the signal indicating a temperature of the recording head.

20. A recording apparatus comprising:

a recording head which records an image on a recording medium;

a temperature sensor, an output signal of which changes in level in accordance with change in temperature of the recording head;

a reference signal generation circuit which generates a level-changeable reference signal;

a level memory which rewritably stores therein a first signal level and a second signal level which determine a range where a level of the reference signal changes;

a control circuit which controls the reference signal generation circuit so as to make a level of the reference signal change from the first signal level to the second signal level stored in the level memory; and a comparator circuit which compares the level of the reference signal and a level of the output signal, wherein:

the reference signal generation circuit includes a pulse signal generation circuit which generates a pulse signal having a predetermined cycle, the pulse signal being generated in a sampling period which is made up of a plurality of the predetermined cycles, in such a manner that a total high-level period of the pulse signal in any of the predetermined cycles is the same and there are two or more kinds of patterns of periods during which the pulse signal is maintained at a high level in the predetermined cycle, and a smoothing circuit which smoothes the pulse signal generated by the pulse signal generation circuit and outputs the smoothed pulse signal as the reference signal; and the control circuit changes a voltage of the reference signal within a range from the first signal level to the second signal level by changing a total high-level period of the pulse signal generated by the pulse signal generation circuit within each of the predetermined cycles on a sampling period basis as a unit, and the control circuit determines that the level of the reference signal has reached the level of the output signal in accordance with a result of comparison at the comparator circuit and generates, as a detected temperature signal indicating a current temperature of the recording head, a signal corresponding to the level of the reference signal generated by the reference signal generation circuit at a time when the level of the reference signal reaches the level of the output signal.

21. The recording apparatus according to claim 20, further comprising:

a determiner which determines that a current temperature of the recording head indicated by the detected temperature signal has reached a predetermined upper limit temperature; and a stopper which stops recording performed by the recording head after the recording head completes recording on one recording medium, when it is determined that the current temperature of the recording head has reached the predetermined upper limit temperature.

* * * * *